(12) United States Patent
Yoon et al.

(10) Patent No.: US 9,672,942 B2
(45) Date of Patent: Jun. 6, 2017

(54) DATA DECODING METHOD OF NON-VOLATILE MEMORY DEVICE AND APPARATUS FOR PERFORMING THE METHOD

(71) Applicants: Pil Sang Yoon, Hwaseong-si (KR); Beom Kyu Shin, Seongnam-si (KR); Jun Jin Kong, Yongin-si (KR); Kwang Hoon Kim, Uiwang-si (KR); Ung Hwan Kim, Seongnam-si (KR); Myung Kyu Lee, Seoul (KR)

(72) Inventors: Pil Sang Yoon, Hwaseong-si (KR); Beom Kyu Shin, Seongnam-si (KR); Jun Jin Kong, Yongin-si (KR); Kwang Hoon Kim, Uiwang-si (KR); Ung Hwan Kim, Seongnam-si (KR); Myung Kyu Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 92 days.

(21) Appl. No.: 14/693,446

(22) Filed: Apr. 22, 2015

(65) Prior Publication Data

US 2015/0303948 A1    Oct. 22, 2015

(30) Foreign Application Priority Data

Apr. 22, 2014   (KR) .................. 10-2014-0047903

(51) Int. Cl.
*H03M 13/11*   (2006.01)
*G11C 29/52*   (2006.01)
(Continued)

(52) U.S. Cl.
CPC .......... *G11C 29/52* (2013.01); *G06F 11/1012* (2013.01); *G11C 11/5642* (2013.01);
(Continued)

(58) Field of Classification Search
CPC ..................................................... H03M 13/09
(Continued)

(56) References Cited

U.S. PATENT DOCUMENTS 7,533,328 B2   5/2009   Alrod et al.
7,814,401 B2   10/2010   Alrod et al.
(Continued)

OTHER PUBLICATIONS

Yu Cai et al.; "Threshold Voltage Distribution in MLC NAND Flash Memory: Characterization, Analysis, and Modeling"; EDAA; 2013; pp. 1-6.

(Continued)

*Primary Examiner* — Fritz Alphonse
(74) *Attorney, Agent, or Firm* — Sughrue Mion, PLLC

(57) ABSTRACT

A method of decoding data of a non-volatile memory device is provided. The method includes a first decoding operation of reading first hard decision data from the non-volatile memory device using a first hard decision read level and performing decoding using the first hard decision data; a second decoding operation of reading first soft decision data from the non-volatile memory device when the decoding fails in the first decoding operation, and performing decoding using the first soft decision; and a third decoding operation of changing from the first hard decision read level to a second hard decision read level when the decoding fails in the second decoding operation, reading second hard decision data using the second hard decision read level, and performing decoding either using the second hard decision data or using both the second hard decision data and the first soft decision data.

19 Claims, 37 Drawing Sheets

(51) Int. Cl.
  *G06F 11/10* (2006.01)
  *H03M 13/45* (2006.01)
  *H03M 13/00* (2006.01)
  *G11C 11/56* (2006.01)
  *G11C 29/04* (2006.01)

(52) U.S. Cl.
  CPC ....... *H03M 13/45* (2013.01); *H03M 13/6325* (2013.01); *G11C 2029/0411* (2013.01)

(58) Field of Classification Search
  USPC ........................................ 714/780, 784, 790
  See application file for complete search history.

(56) References Cited

U.S. PATENT DOCUMENTS

| | | | |
|---|---|---|---|
| 7,966,546 B2 | 6/2011 | Mokhlesi et al. | |
| 7,966,550 B2 | 6/2011 | Mokhlesi et al. | |
| 7,975,192 B2 | 7/2011 | Sommer et al. | |
| 8,156,403 B2 | 4/2012 | Shalvi et al. | |
| 8,169,825 B1 | 5/2012 | Shalvi et al. | |
| 8,320,183 B2 | 11/2012 | Ha et al. | |
| 2009/0319843 A1* | 12/2009 | Meir ................... | G06F 11/1068 714/746 |
| 2010/0199149 A1 | 8/2010 | Weingarten et al. | |
| 2010/0251076 A1 | 9/2010 | Wu et al. | |
| 2011/0096612 A1 | 4/2011 | Steiner et al. | |
| 2011/0258371 A1 | 10/2011 | Yang et al. | |
| 2012/0005558 A1 | 1/2012 | Steiner et al. | |
| 2014/0223255 A1* | 8/2014 | Lu ....................... | G06F 11/1068 714/758 |
| 2015/0067446 A1* | 3/2015 | Yen .................... | H03M 13/1105 714/768 |
| 2015/0186212 A1* | 7/2015 | Lin ..................... | G06F 11/1072 714/764 |

OTHER PUBLICATIONS

Vijay Nagarajan et al.; "High-throughput VLSI Implementations of Iterative Decoders and Related Code Construction Problems"; Journal of VLSI Signal Processing; vol. 49; 2007; pp. 185-206.

* cited by examiner

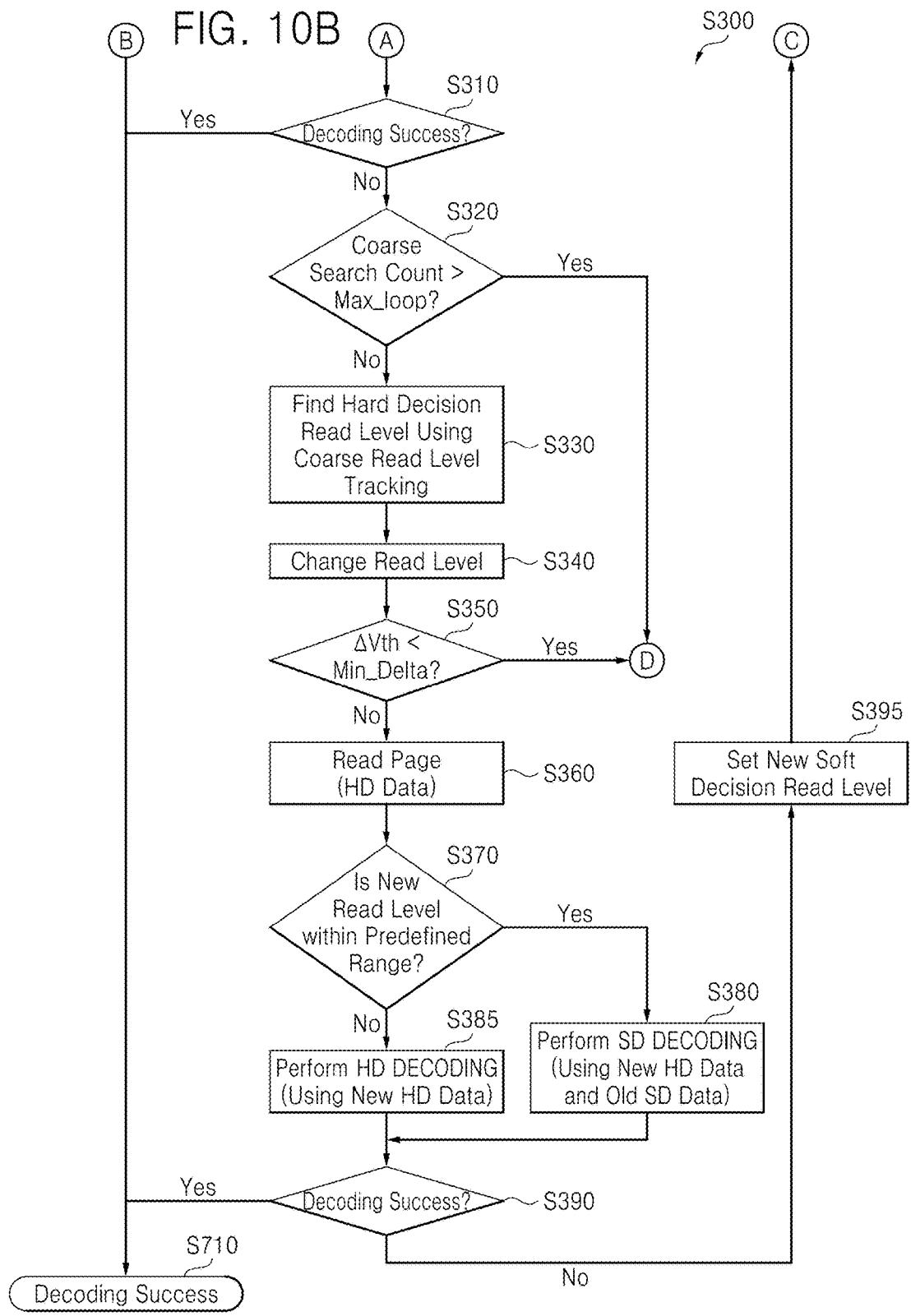

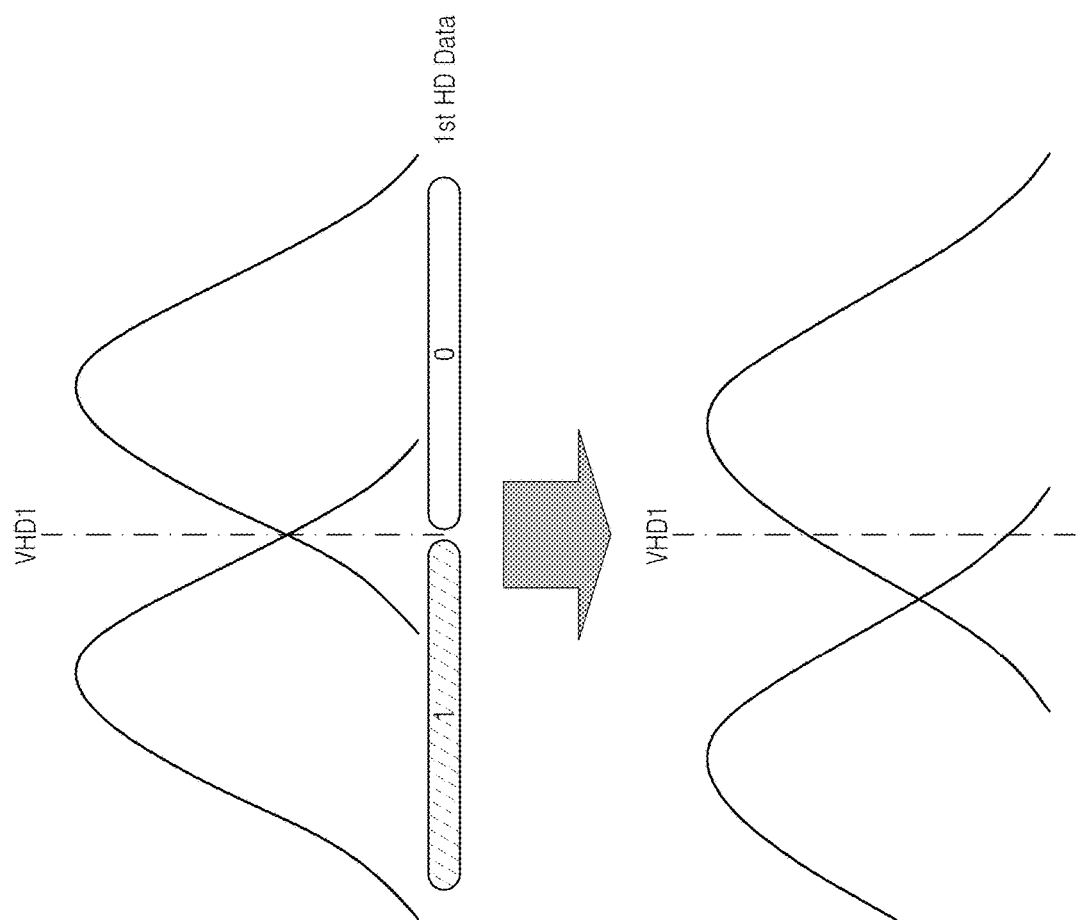

DATA DECODING METHOD OF NON-VOLATILE MEMORY DEVICE AND APPARATUS FOR PERFORMING THE METHOD

CROSS-REFERENCE TO RELATED APPLICATIONS

This application claims priority from Korean Patent Application No. 10-2014-0047903 filed on Apr. 22, 2014, the disclosure of which is hereby incorporated by reference in its entirety.

BACKGROUND

1. Field

Methods and apparatuses consistent with exemplary embodiments relate to a non-volatile memory device, and more particularly, to a method of decoding data in a non-volatile memory device and apparatus for performing the method.

2. Description of Related Art

In order to secure the reliability of data that has been read out in a non-volatile memory system, e.g., a flash memory system, methods of correcting errors using hard decision data as well as methods of correcting errors using soft decision data have been introduced and used. The methods using soft decision data are likely to correct more errors than the methods using hard decision data. In other words, the methods using soft decision data show higher error correction performance than the methods using hard decision data. However, many read operations are required to obtain soft decision data in a non-volatile memory system. As a result, using soft decision data leads to an increase of data reliability on one hand, but it leads a decrease of readout performance of products on the other hand.

SUMMARY

One or more exemplary embodiments provide a method of decoding data in a non-volatile memory device, by which different error correction operations are defined and selectively used, thereby optimizing error correction performance and data restoration time; and an apparatus for performing the method.

According to an aspect of an exemplary embodiment, there is provided a method of decoding data of a non-volatile memory device. The method includes setting a plurality of decoding modes and selecting and performing at least one of the decoding modes according to a degradation index of the non-volatile memory device.

According to another aspect of an exemplary embodiment, there is provided a method of decoding data of a non-volatile memory device. The method includes a first decoding operation including reading first hard decision data from the non-volatile memory device using a first hard decision read level and performing decoding using the first hard decision data; a second decoding operation including reading first soft decision data from the non-volatile memory device when the decoding fails in the first decoding operation and performing decoding using the first soft decision; and a third decoding operation including changing the first hard decision read level to a second hard decision read level when the decoding fails in the second decoding operation, reading second hard decision data using the second hard decision read level, and performing decoding either using the second hard decision data, or using both the second hard decision data and the first soft decision data.

According to an aspect of an exemplary embodiment, there is provided a method of error correction code (ECC) decoding, the method including reading hard decision data from a non-volatile memory device using a hard decision read level and performing ECC decoding using the read hard decision data to detect and correct errors in the hard decision data; when the ECC decoding fails to correct the errors in the hard decision data, reading soft decision data and performing ECC decoding using the soft decision data to detect and correct errors in the soft decision data; and when the ECC decoding fails to correct the errors in the soft decision data, changing the hard decision read level, rereading the hard decision data again using the changed hard decision read level, and performing ECC decoding using the reread hard decision data.

BRIEF DESCRIPTION OF THE DRAWINGS

The above and/or other aspects will become more apparent by describing in detail certain exemplary embodiments with reference to the attached drawings in which:

FIGS. 10A through 10D are detailed flowcharts of operations in a data decoding method according to some exemplary embodiments;

FIGS. 11A and 11B are diagrams illustrating a change in distribution due to hard decision data reading and memory deterioration;

DETAILED DESCRIPTION

Figure 1:
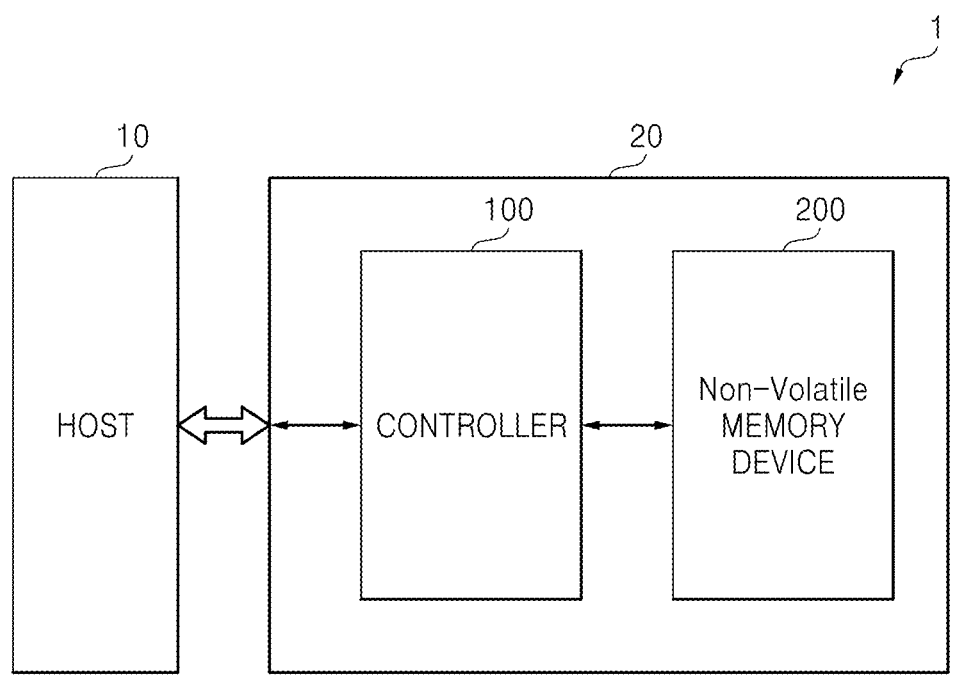
FIG. 1 is a schematic block diagram of an electronic system according to some exemplary embodiments.

The inventive concept now will be described more fully hereinafter with reference to the accompanying drawings, in which exemplary embodiments are shown. This inventive concept may, however, be embodied in many different forms and should not be construed as limited to the exemplary embodiments set forth herein. Rather, these exemplary embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular exemplary embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, operations, operations, elements, and/or components, but do not preclude the presence or addition of one or more other features, regions, integers, operations, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

When a NAND flash memory system uses an error correction code (ECC) decoder that can decode both hard decision data and soft decision data, it is able to read data stored in NAND flash memory using one or more methods. Usually, errors in data read from NAND flash memory are more likely to be corrected when soft decision data is used than when hard decision data read from the NAND flash memory is used.

However, a time taken to obtain soft decision data from NAND flash memory is longer than a read time during which hard decision data is obtained in the NAND flash memory. This additional time to obtain the soft decision data leads the decrease of readout performance of a NAND flash memory system. As a result, while the reliability of data recorded by a user is increased, a longer time taken to process data at the user's request weakens the competitiveness of products.

Figure 2:
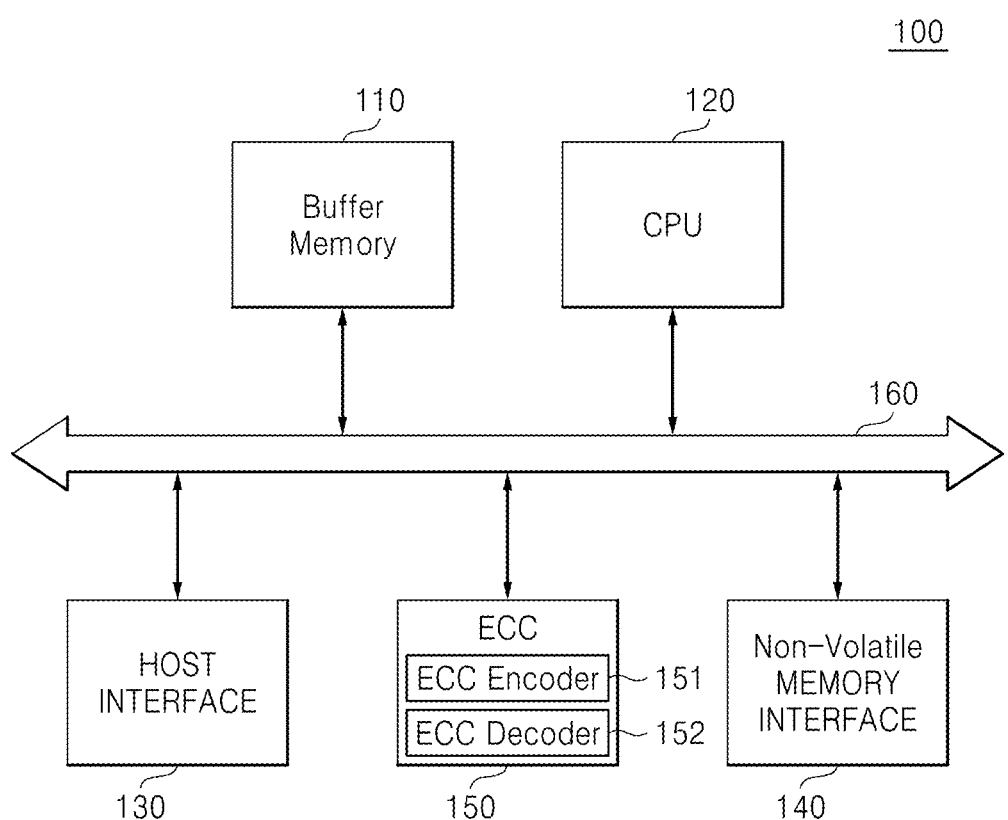
FIG. 2 is a block diagram of a controller illustrated in FIG. 1 according to some exemplary embodiments.

FIG. 1 is a schematic block diagram of an electronic system according to some exemplary embodiments. FIG. 2 is a block diagram of a memory controller illustrated in FIG. 1.

Referring to FIG. 1, an electronic system 1 includes a host 10 and a non-volatile memory system 20. The non-volatile memory system 20 coupled with the host 10 includes a memory controller 100 and a non-volatile memory device 200.

The non-volatile memory system 20 may be a solid state drive (SSD), a multimedia card (MMC), an embedded MMC (eMMC), or a secure digital (SD) card, but it is not restricted thereto. The non-volatile memory device 200 may be a flash memory device but is not restricted thereto. For example, the non-volatile memory device 200 may be a phase-change random access memory (PRAM) device, a magnetoresistive RAM (MRAM) device, a resistive RAM (ReRAM) device, or a ferroelectric RAM (FeRAM) device. When the non-volatile memory device 200 is a flash memory device, the non-volatile memory device 200 may be a NAND flash memory device using floating-gate technology or charge trap flash (CTF) technology. Memory cell transistors may be arranged in two or three dimensions in the non-volatile memory device 200, which will be described in detail later.

The memory controller 100 controls the overall operation of the non-volatile memory system 20 and controls the overall data exchange between the host 10 and the non-volatile memory device 200. For instance, the memory controller 100 controls the non-volatile memory device 200 to write or read data at the request of the host 10. The memory controller 100 also controls a series of internal operations (e.g., performance adjustment, merging, and wear leveling) for the characteristics of the non-volatile memory device 200 or for efficient management of the non-volatile memory device 200.

The non-volatile memory device 200 is a storage for storing data in a non-volatile manner. The non-volatile memory device 200 may store an operating system (OS), a variety of programs, and/or diverse types of data.

Referring to FIG. 2, the memory controller 100 may include a buffer memory 110, a central processing unit (CPU) 120, a host interface 130, a non-volatile memory interface 140, an error correction code (ECC) block 150, and a bus 160. The buffer memory 110 is volatile memory, e.g., static random access memory (SRAM) or dynamic RAM (DRAM), but the buffer memory 110 is not restricted thereto. The buffer memory 110 functions as a buffer that temporarily stores data to be stored in the non-volatile memory device 200 and data that has been read from the non-volatile memory device 200. The buffer memory 110 is included in the memory controller 100 in the current exemplary embodiments, but the buffer memory 110 may be implemented outside the controller 100 in other exemplary embodiments.

The host interface 130 has an interface protocol to communicate with the host 10. The interface protocol may be an ultra high speed (UHS) (i.e., UHS-I or UHS-II), peripheral component interconnect-express (PCI-E), advanced technology attachment (ATA), serial ATA (SATA), parallel ATA (PATA), or a serial attached SCSI (SAS), etc. However, the interface protocol between the host 10 and the non-volatile memory system 20 is not restricted to the above examples and may be one of other interface protocols such as a universal serial bus (USB) protocol, an MMC protocol, an enhanced small disk interface (ESDI) protocol, and an integrated drive electronics (IDE) protocol, etc.

The non-volatile memory interface 140 may provide an interface for data between the non-volatile memory device 200 and the memory controller 100.

The CPU 120 performs overall control to write data to and read data from the non-volatile memory device 200. The CPU 120 may control data exchange among the buffer memory 110, the host interface 130, the ECC block 150, and the non-volatile memory interface 140 through the bus 160. The CPU 120 may also drive a flash translation layer (FTL).

The ECC block 150 encodes data to be stored in the non-volatile memory device 200 and decodes data read from the non-volatile memory device 200 to detect and correct errors in the data that has been read. The ECC block 150 may include an ECC encoder 151 encoding data to be stored in the non-volatile memory device 200 and an ECC decoder 152 decoding data read from the non-volatile memory device 200.

The ECC decoder 152 may perform hard decision decoding using hard decision data read from the non-volatile memory device 200. The ECC decoder 152 may also perform soft decision decoding using soft decision data read from the non-volatile memory device 200. A decoder engine that performs hard decision decoding and a decoder engine that performs soft decision decoding may be separately implemented in some exemplary embodiments, or may be integrated into one according to other exemplary embodiments. As used herein, hard decision decoding includes error correction based on the hard decision data that is read, and soft decision decoding includes error correction based on the soft decision data that is read.

The non-volatile memory system 20 may also include other elements such as a read only memory (ROM) that stores code data executed at power-on, a clock module that generates a clock signal, and a timer, etc.

Figure 3:
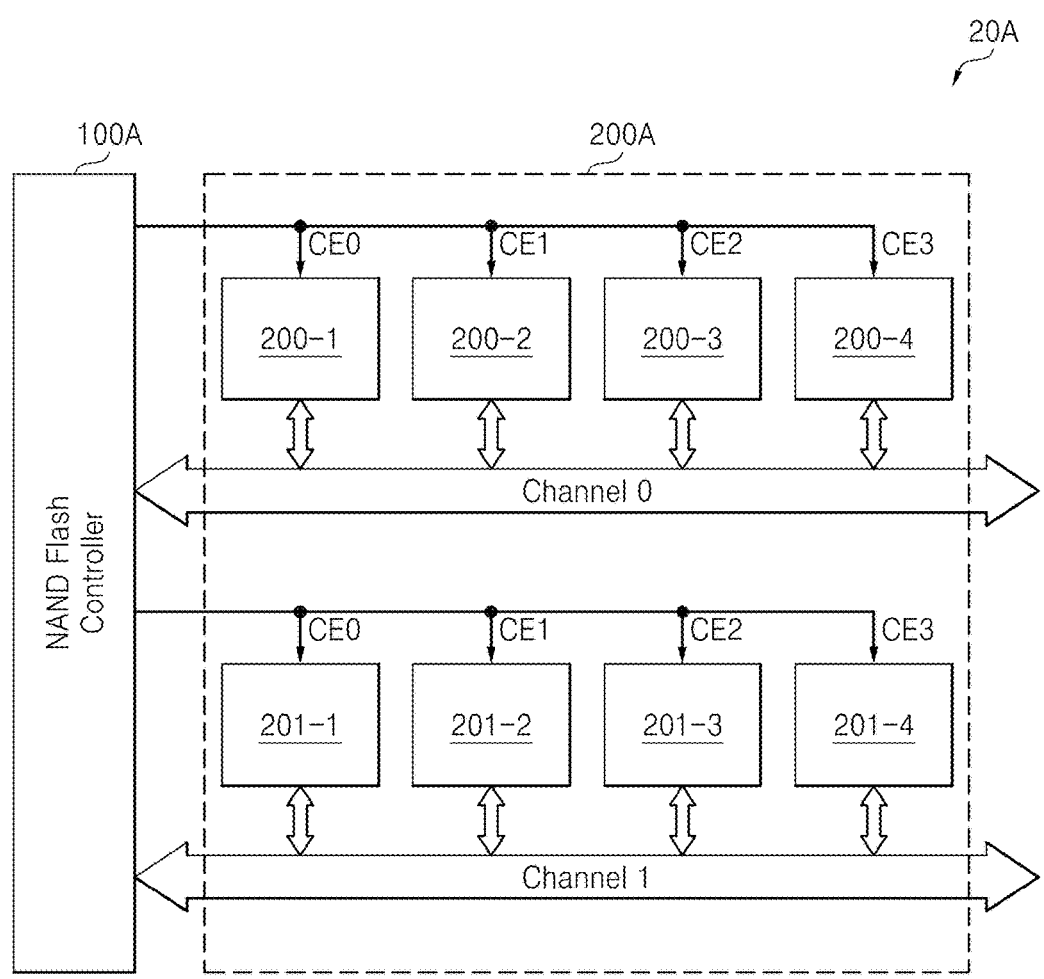
FIG. 3 is a schematic diagram of the structure of a non-volatile memory system according to some exemplary embodiments.

FIG. 3 is a schematic diagram of the structure of a non-volatile memory system according to some exemplary embodiments. Referring to FIG. 3, a non-volatile memory system 20A may include a controller 100A and a non-volatile memory device 200A. The controller 100A may be a NAND flash controller and the non-volatile memory device 200A may include a plurality of NAND flash memory devices 200-1 through 200-4 and 201-1 through 201-4. Although the non-volatile memory system 20A has a 2-channel/4-bank hardware structure in the exemplary embodiment illustrated in FIG. 3, the inventive concept is not restricted to this exemplary embodiment. Each NAND flash memory device may be implemented as a NAND flash chip.

In the non-volatile memory system 20A illustrated in FIG. 3, the controller 100A and the non-volatile memory device 200A are coupled with each other through two channels Channel0 and Channel1 to each of which four flash memory devices are coupled. For instance, four flash memory devices 200-1 through 200-4 are coupled to the first channel Channel0 and four flash memory devices 201-1 through 201-4 are coupled to the second channel Channel1. The flash memory devices coupled to the same channel share an input/output (I/O) bus and a control signal with one another. It will be apparent that the numbers of channels and banks are not restricted to the above example but can be changed.

Figure 4:
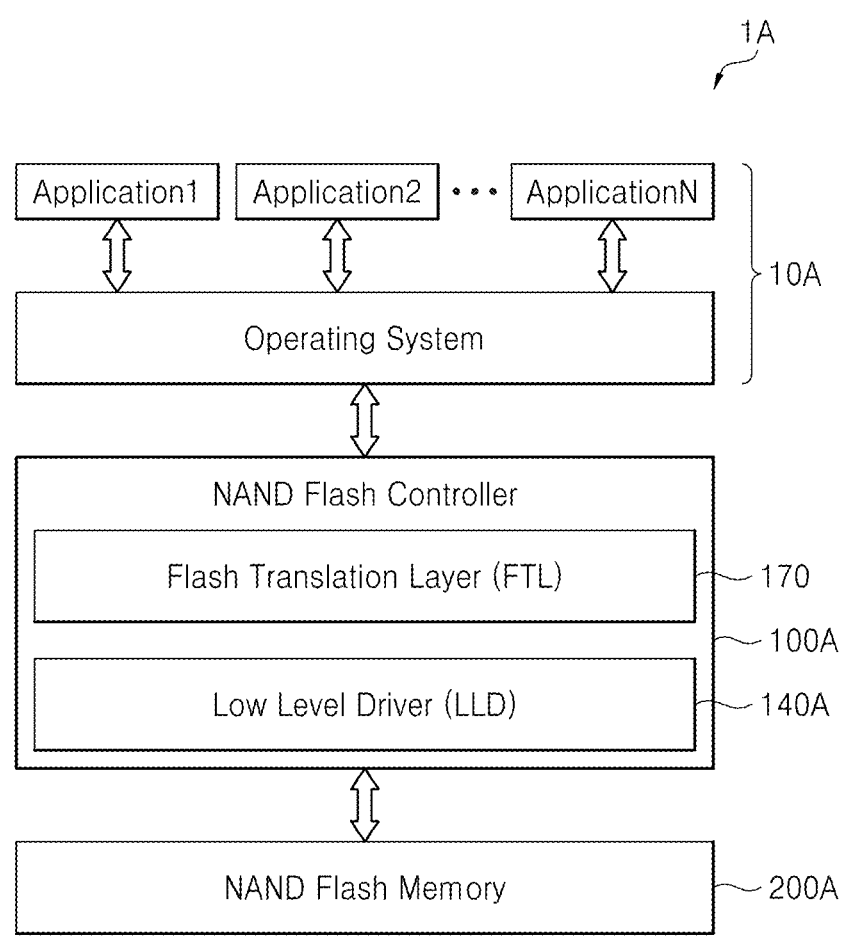
FIG. 4 is a diagram of the hierarchical structure of an electronic system according to some exemplary embodiments.

FIG. 4 is a diagram of the hierarchical structure of an electronic system according to some exemplary embodiments. The electronic system 1A may comprise a host 10A, a NAND flash controller 100A, and a NAND flash memory 200A. The host 10A may include an operating system (OS) and application programs Application1 through ApplicationN running on the OS. The NAND flash controller 100A may include a flash translation layer (FTL) 170 and a low level driver (LLD) 140A. The LLD 140A may be the memory interface 140 illustrated in FIG. 2, or a part of the memory interface 140.

The FTL 170 is a software layer for managing the flash memory device 200A. The FTL 170 is placed between the host 10A and the LLD 140A to allow the flash memory device 200A to be used without modifying a file system. The FTL 170 may perform a logical-to-physical address mapping function to link a logical address of the file system to a physical address of the flash memory device 200A using an address mapping table, a garbage collection function to manage a valid page at a block in the flash memory device 200A, a wear-leveling function that prevents a particular block from wearing too fast and that is used by managing blocks to keep the available number of erases as similar as possible to one another, an interleaving function, and a power-off recovery function to recover data from corruption caused by sudden power-off. The LLD 140A is a layer that provides NAND flash interface for direct access to the flash memory device 200A.

Figure 5:
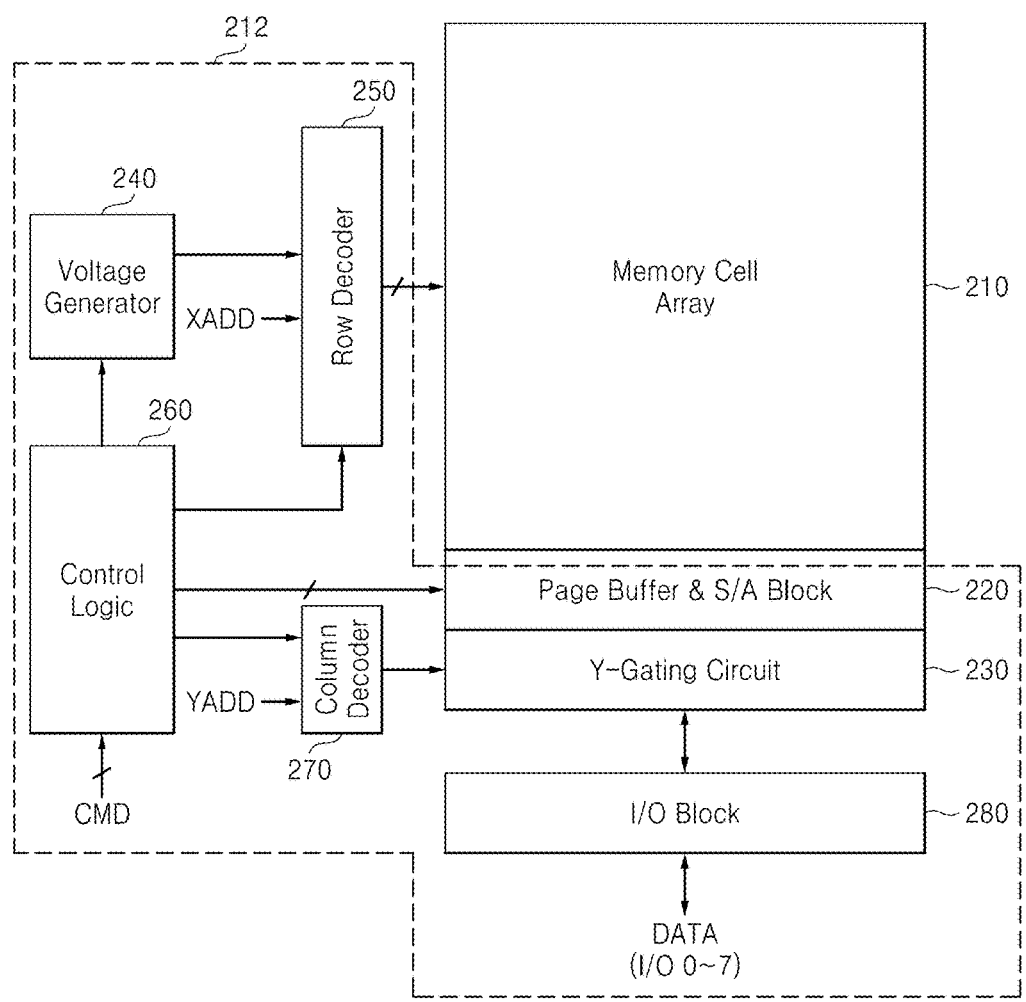
FIG. 5 is a detailed block diagram of a non-volatile memory device according to some exemplary embodiments.
Figure 6:
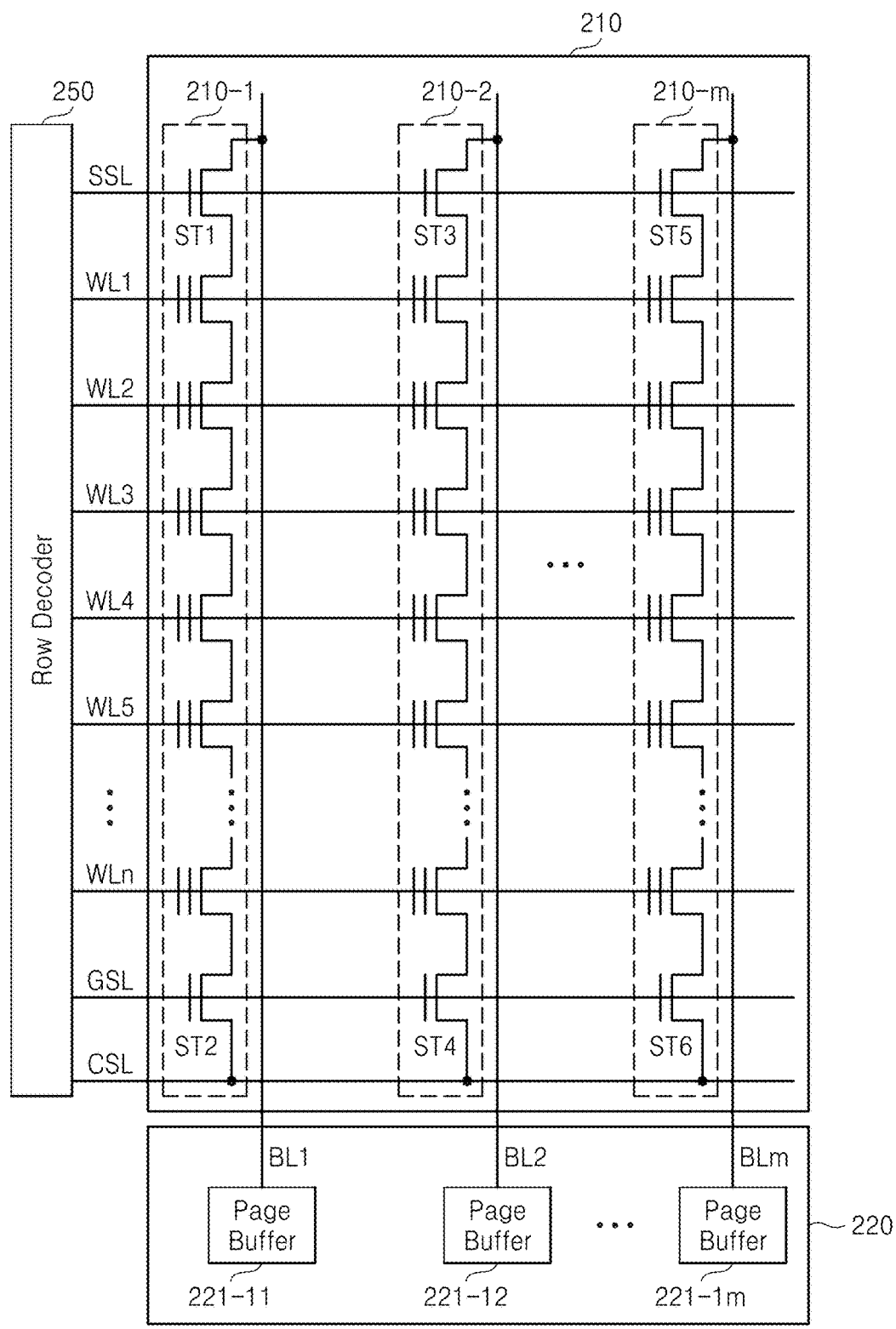
FIG. 6 is detailed diagram of a memory cell array illustrated in FIG. 5 according to some exemplary embodiments.
Figure 7:
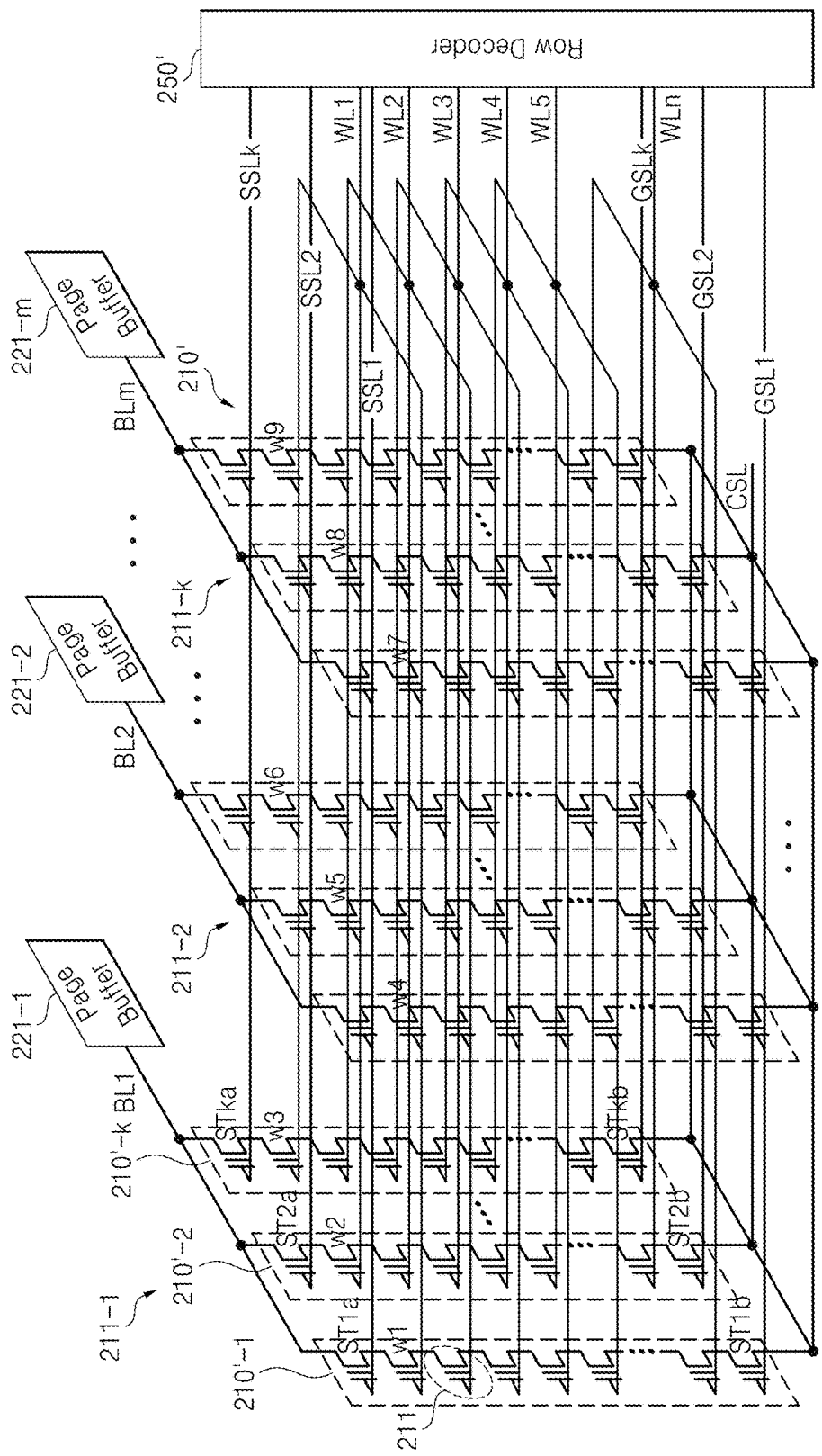
FIG. 7 is detailed diagram of the memory cell array illustrated in FIG. 5 according to other exemplary embodiments.

FIG. 5 is a detailed block diagram of a non-volatile memory device according to some exemplary embodiments. FIG. 6 is detailed diagram of a memory cell array illustrated in FIG. 5 according to some exemplary embodiments. FIG. 7 is detailed diagram of the memory cell array illustrated in FIG. 5 according to other exemplary embodiments.

Referring to FIG. 5, a non-volatile memory device 200-1 includes a memory cell array 210 and an access circuit 212.

The memory cell array 210 includes NAND memory cell strings respectively connected to bit lines and each of the NAND memory cell strings includes a plurality of non-volatile memory cells connected in series to one another. Each NAND memory cell string may be laid out (or embodied) on one plane (or layer) in two dimensions as illustrated in FIG. 6. Alternatively, the memory cell array 210 may be implemented in three dimensions, as illustrated in FIG. 7, using a wafer stack, a chip stack, or a cell stack.

Referring to FIG. 6, the memory cell array 210, in a two dimensional arrangement, includes a plurality of NAND memory cell strings 210-1 to 210-m. Each NAND memory cell string 210-1 to 210-m includes non-volatile memory cells connected in series between a string selection transistor ST1 connected to a bit line BL1 and a ground selection transistor ST2 connected to a common source line (CSL). A gate of the string selection transistor ST1 is connected to a string selection line (SSL). Gates of the respective non-volatile memory cells are connected to a plurality of word lines WL1 through WLn, respectively. A gate of the ground selection transistor ST2 is connected to a ground selection line (GSL). The NAND memory cell strings 210-1 through 210-m are respectively connected to page buffers 221-11 through 221-1m in FIG. 6. At this time, the number of word lines may vary with exemplary embodiments.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648. Referring to FIG. 7, the memory cell array 210', in a three dimensional arrangement, includes a plurality of NAND memory cell planes 211-1 to 211-k. Each NAND memory cell plane 211-1 to 211-k includes a plurality of NAND memory cell strings 210'-1 to 210'-k. Each NAND memory cell string 210'-1 to 210'-k includes non-volatile memory cells connected in series between a string selection transistor and a ground selection transistor. Thus, for example, NAND memory cell string 210'-1 of plane 211-1 includes non-volatile memory cells connected in series between a string selection transistor ST1a and a ground selection transistor ST1b, and NAND memory cell string 210'-2 of plane 211-1 includes non-volatile memory cells connected in series between a string selection transistor ST2a and a ground selection transistor ST2b, and NAND memory cell string 210'-k of plane 211-k includes non-volatile memory cells connected in series between a string selection transistor STka and a ground selection transistor STkb. In each plane 211-1 to 211-k, the string selection transistors ST1a, ST2a to STka are connected together and to a respective bit line BL1 to BLm for the plane. Thus, string selection transistors ST1a, ST2a, and STka of plane 211-1 are connected together to bit line BL1, and string selection transistors ST1a, ST2a, and STka of plane 211-2 are connected together to bit line BL2, and so on. The ground selection transistors ST1b, ST2b to STkb of the planes are connected together to a common source line (CSL). Gates of the string selection transistors in a similar position within each plane are connected together to respective string selection lines SSL1 to SSLk. For example, the gate of the string selection transistor ST1a of plane 211-1 is connected to the gate of the string selection transistor ST1a of plane 211-2, and to the gate of the string selection transistor ST1a of plane 211-k, and these gates are connected to a string selection line (SSL1). Similarly, the gate of the string selection transistor ST2a of plane 211-1 is connected to the gate of the string selection transistor ST2a of plane 211-2, and to the gate of the string selection transistor ST2a of plane 211-k, and these gates are connected to a string selection line (SSL2), etc. Gates of the non-volatile memory cells in planes orthogonal to the planes 211-1, 211-2 to 211-k are connected together and to a plurality of word lines WL1 through WLn, respectively. For example, in FIG. 7, gates of non-volatile memory cells W1 to W9 are connected together and to word line WL1. Gates of the ground selection transistors in a similar position within each plane are connected together to respective ground selection lines GSL1 to GSLk. For example, the gate of the ground selection transistor ST1b of plane 211-1 is connected to the gate of the ground selection transistor ST2b of plane 211-2, and to the gate of the ground selection transistor STkb of plane 211-k, and these gates are connected to a ground selection line (GSL1). Similarly, the gate of the ground selection transistor ST2b of plane 211-1 is connected to the gate of the ground selection transistor ST2b of plane 211-2, and to the gate of the ground selection transistor ST2b of plane 211-k, and these gates are connected to a ground selection line (GSL2), etc. The bit lines BL1 to BLm of NAND memory cell planes 211-1 through 211-k are respectively connected to page buffers 221-1 through 221-m in FIG. 7. At this time, the number of word lines may vary with exemplary embodiments.

The non-volatile memory cells included in each NAND memory cell string may be implemented using flash electrically erasable programmable read-only memory (EEPROM) which can store one or more bits. Accordingly, each of the non-volatile memory cells may be embodied by a NAND flash memory cell, e.g., a multi-level cell (MLC), storing at least one bit.

The access circuit 212 accesses the memory cell array 210 to perform a data access operation, e.g., a program operation, a read operation, or an erase operation, according to a command (or command sets) and an address received from an outside, e.g., from the memory controller 100. The access circuit 212 may include a voltage generator 240, a row decoder 250, a control logic 260, a column decoder 270, a page buffer and sense amplifier (S/A) block 220, a Y-gating circuit 230, and an I/O block 280.

The voltage generator 240 may generate a voltage for a data access operation in response to a signal generated by the control logic 260. The voltage generator 240 generates a program voltage and a program-verify voltage to perform a program operation, generates read voltages to perform a read operation, generates an erase voltage and an erase-verify voltage to perform an erase operation, and outputs the voltages for each of the operations to the row decoder 250. The read voltages include a hard decision read voltage used to obtain hard decision data and a soft decision read voltage used to obtain soft decision data. The hard decision read voltage and the soft decision read voltage will be described later.

The control logic 260 controls the overall operation of the access circuit 212 in response to a control signal CMD output from the memory controller 100. The control logic 260 may control memory read state information to be sensed during a memory read operation and data that has been read to be output to the memory controller 100.

Under the control of the control logic 260, the column decoder 270 decodes column addresses YADD and outputs a plurality of select signals to the Y-gating circuit 230.

The page buffer and S/A block 220 includes a plurality of page buffers. The page buffers are respectively connected with bit lines. Each of the page buffers may operate as an S/A which senses and amplifies a voltage of each bit line during a read operation according to the control of the control logic 260. Each page buffer may also function as a latch that temporarily stores sensed and amplified data, i.e., data read from the memory cell array 210 (hereinafter, referred to as read data). The read data may be either hard decision data or soft decision data. The page buffers may include a buffer for storing hard decision data and a buffer for storing soft decision data individually or may share the buffers with each other.

The Y-gating circuit 230 may control transmission of data between the page buffer and S/A block 220 and the I/O block 280 in response to the select signals received from the column decoder 270. The I/O block 280 may transmit data from an outside to the Y-gating circuit 230 and may transmit data from the Y-gating circuit 230 to the memory controller 100 through a plurality of I/O pins (or a data bus).

Figure 8:
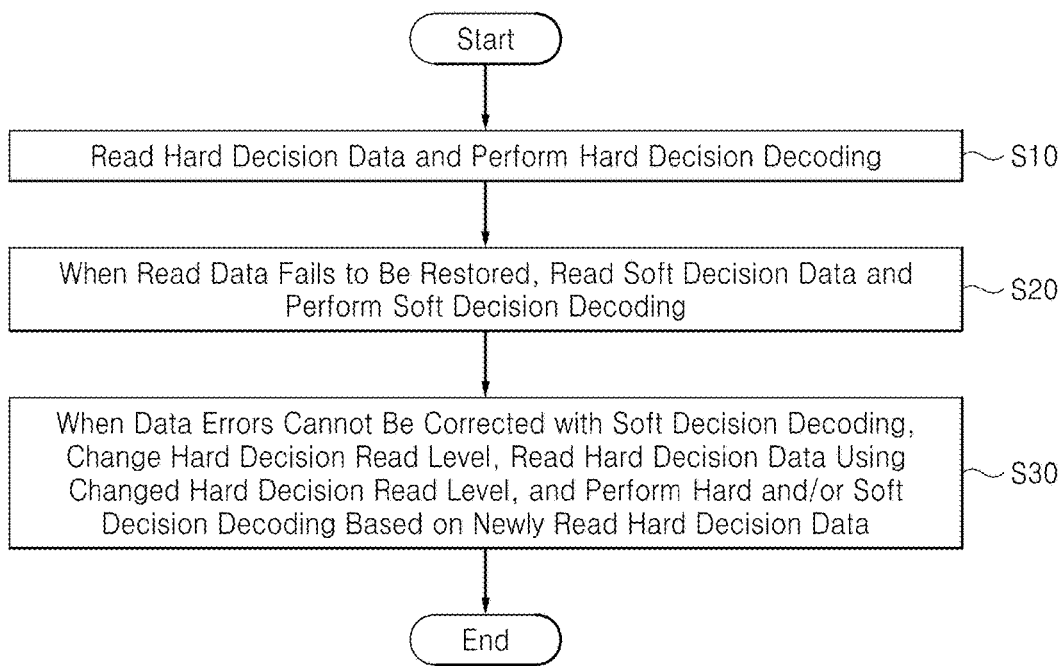
FIG. 8 is a flowchart of a data decoding method according to some exemplary embodiments.

FIG. 8 is a flowchart of a data decoding method according to some exemplary embodiments. The data decoding method may be performed by the memory system 20 illustrated in FIG. 1. The data decoding method includes a plurality of decoding operations. Hard decision data is read from the flash memory 200 and decoding is performed using the hard decision data in a first decoding operation S10.

It takes a shorter amount of time to obtain hard decision data than to obtain soft decision data in the non-volatile memory system 20, but error correction performance decreases when decoding is performed using the hard decision data as compared to a case where decoding is performed using the soft decision data. However, just a small number of errors occur when data is read in the initial use of the non-volatile memory system 20 (i.e., an initial stage in the life of the non-volatile memory system), and therefore, decoding using only hard decision data may be satisfactory. As a result, read performance of the non-volatile memory system 20 can be maximized. When read data fails to be restored in the first decoding operation S10, the non-volatile memory system 20 shifts to a next operation, i.e., a second decoding operation S20, to restore the data.

Soft decision data is read and decoding is performed using the soft decision data in the second decoding operation S20. An additional read operation is performed in the second decoding operation S20. A time taken to restore data in the second decoding operation S20 is longer than a time taken to restore data in the first decoding operation S10, but more errors are corrected in the second decoding operation S20 than in the first decoding operation S10.

A third decoding operation S30 is entered when there are errors that cannot be corrected even in the second decoding operation S20 because the non-volatile memory system 20 has been degraded. A hard decision read level is changed and decoding is performed using hard decision data read using the changed hard decision read level, i.e., a new hard decision read level, in the third decoding operation S30. The data that has been read in a previous operation, e.g., the second decoding operation S20, may be reused in the third decoding operation S30. For instance, decoding may be performed using both hard decision data read using the new hard decision read level and the soft decision data, which has been read in the second decoding operation S20, in the third decoding operation S30. Predefined read level tracking (e.g., at least one among coarse read level tracking and fine read level tracking) may be used in order to find a new hard decision read level.

As described above, according to some exemplary embodiments, as the operations shown in FIG. 8 proceed, a read time increases, but error correction performance also increases. In addition, at least part of data that has been read in a previous operation may be reused in each subsequent decoding operation and a read level may be estimated during read level tracking using at least part of data that has been read in a previous operation instead of performing an additional read operation to find a read level. Accordingly, the increase in time as decoding shifts from operation to operation is reduced, and the decrease of readout performance is also reduced. That is, decoding time becomes faster, and readout performance improves.

As described above, when decoding is performed operation by operation, fast readout performance is maintained when a small number of errors occur in read data during the initial stage of the life of the non-volatile memory system 20, and the decrease in the readout performance is minimized even though the number of errors increases.

FIGS. 9A through 9M are flowcharts of a data decoding method according to different exemplary embodiments. Data decoding methods illustrated in FIGS. 9A through 9M may be performed by the memory system 20 illustrated in FIG. 1.

Figure 9A:
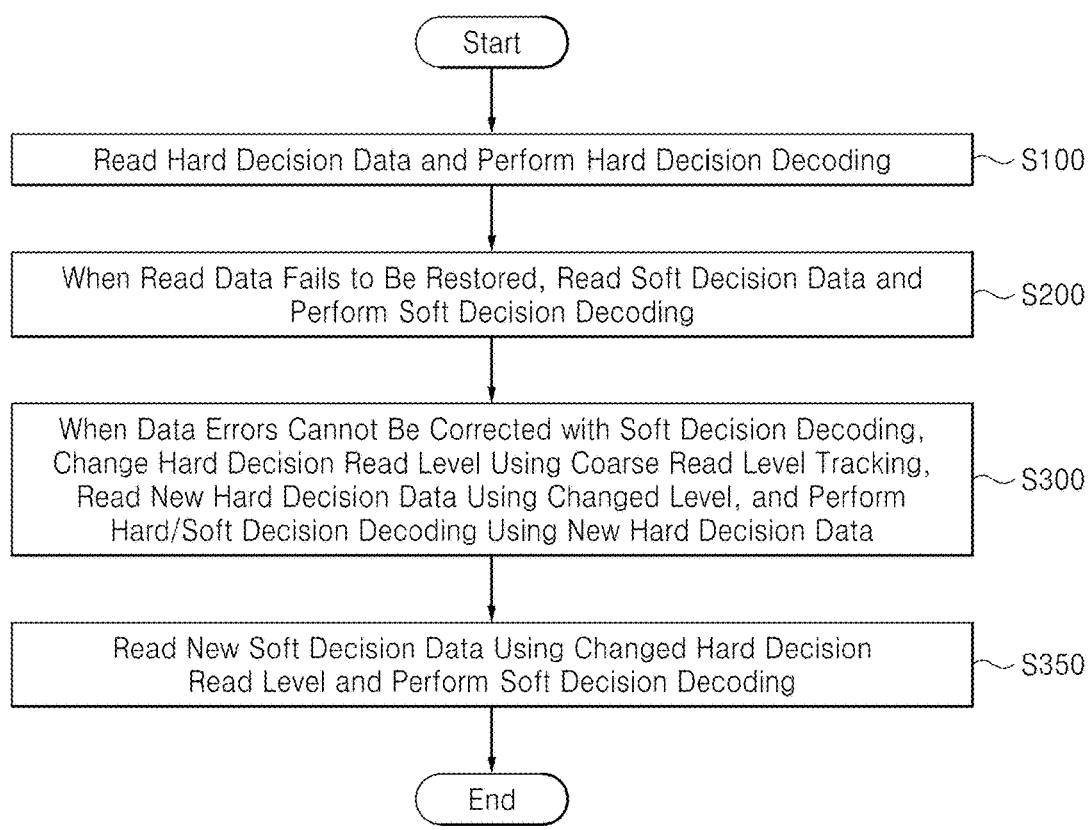
FIGS. 9A through 9M are flowcharts of a data decoding method according to various different exemplary embodiments.

Referring to FIG. 9A, first and second decoding operations S100 and S200 are the same as the first and second decoding operations S10 and S20 illustrated in FIG. 8, and therefore, descriptions thereof will be omitted. Operations S300 and S350 illustrated in FIG. 9A are included in the third decoding operation S30 illustrated in FIG. 8.

In operation S300, a hard decision read level may be newly changed using coarse read level tracking, new hard decision data may be read using the changed hard decision read level, and decoding may be performed using hard decision data read using the changed hard decision read level, i.e., a new hard decision read level. Alternatively, decoding may be performed using the hard decision data read in operation S300 and the soft decision data read in operation S200 together.

Read level tracking is a technique of finding a read level that allows data read errors to be reduced in a distribution, where the distribution is produced by changing an initial distribution of flash memory. Accordingly, when a hard decision read level newly obtained using the read level tracking is used when data is read from the flash memory, the read data is expected to have fewer errors than data that has been read before. When decoding is determined to be a failure as a result of performing decoding using the new hard decision data in operation S300, in operation S350 new soft decision data may be read by performing a soft decision read operation using the new hard decision read level. Soft decision decoding may be performed using the new soft decision data in operation S350, so that more errors can be corrected.

Figure 9B:
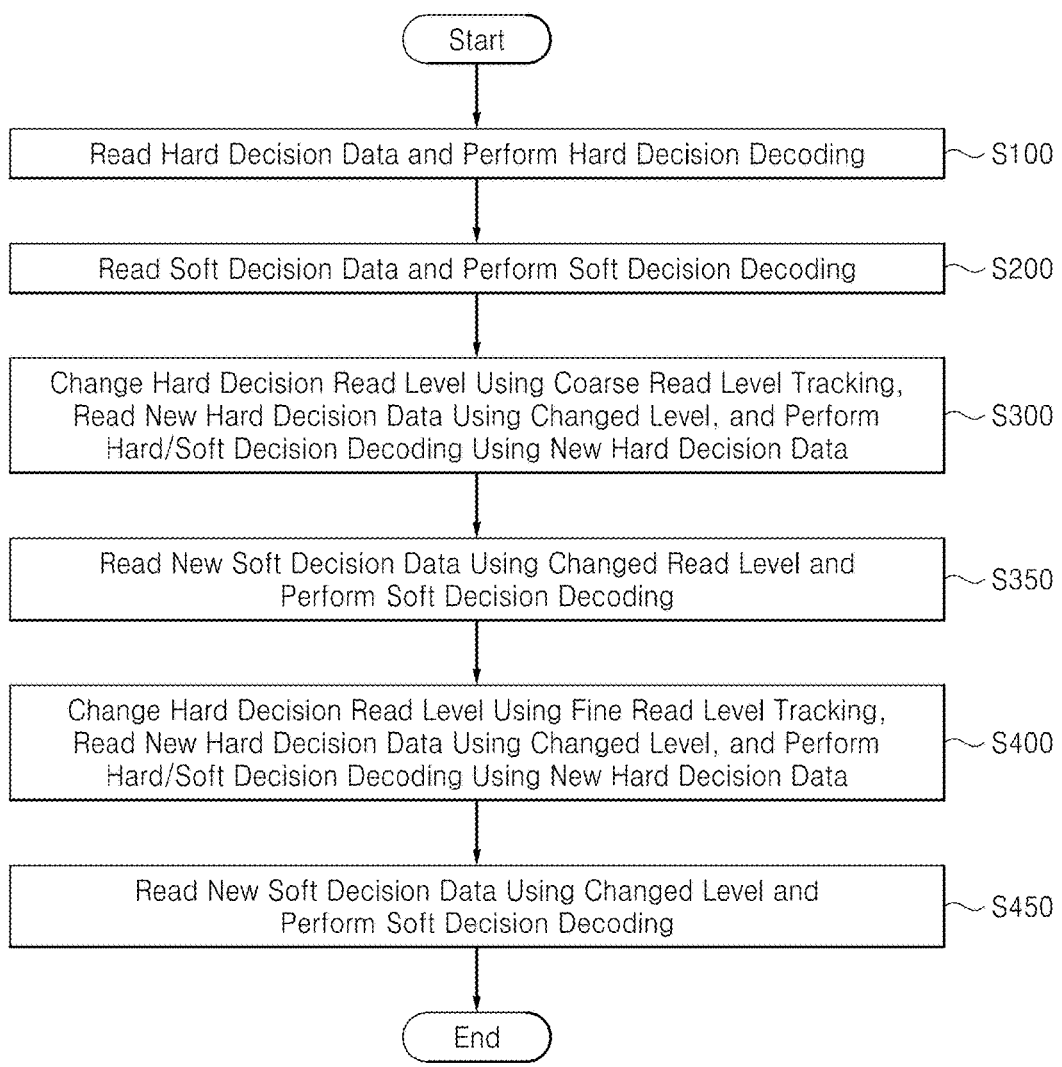

FIG. 9B is a flowchart of a data decoding method according to other exemplary embodiments. The data decoding method illustrated in FIG. 9B further includes a fourth decoding operation (operations S400 and S450) as compared to the data decoding method illustrated in FIG. 9A. A hard decision read level is changed and decoding is performed using data read using the changed hard decision read level, i.e., a new hard decision read level, in the fourth decoding operation (i.e., operations S400 and S450) similarly to the third decoding operation (i.e., operations S300 and S350). However, a read level tracking technique (e.g., fine read level tracking) used to find a new hard decision read level in the fourth decoding operation (i.e., operations S400 and S450) is different from the read level tracking technique (e.g., coarse read level tracking) used to find a new hard decision read level in the third decoding operation (i.e., operations S300 and S350). The fine read level tracking technique may use high-order (e.g., second or third order) regression, but the inventive concept is not restricted thereto.

Figure 9C:
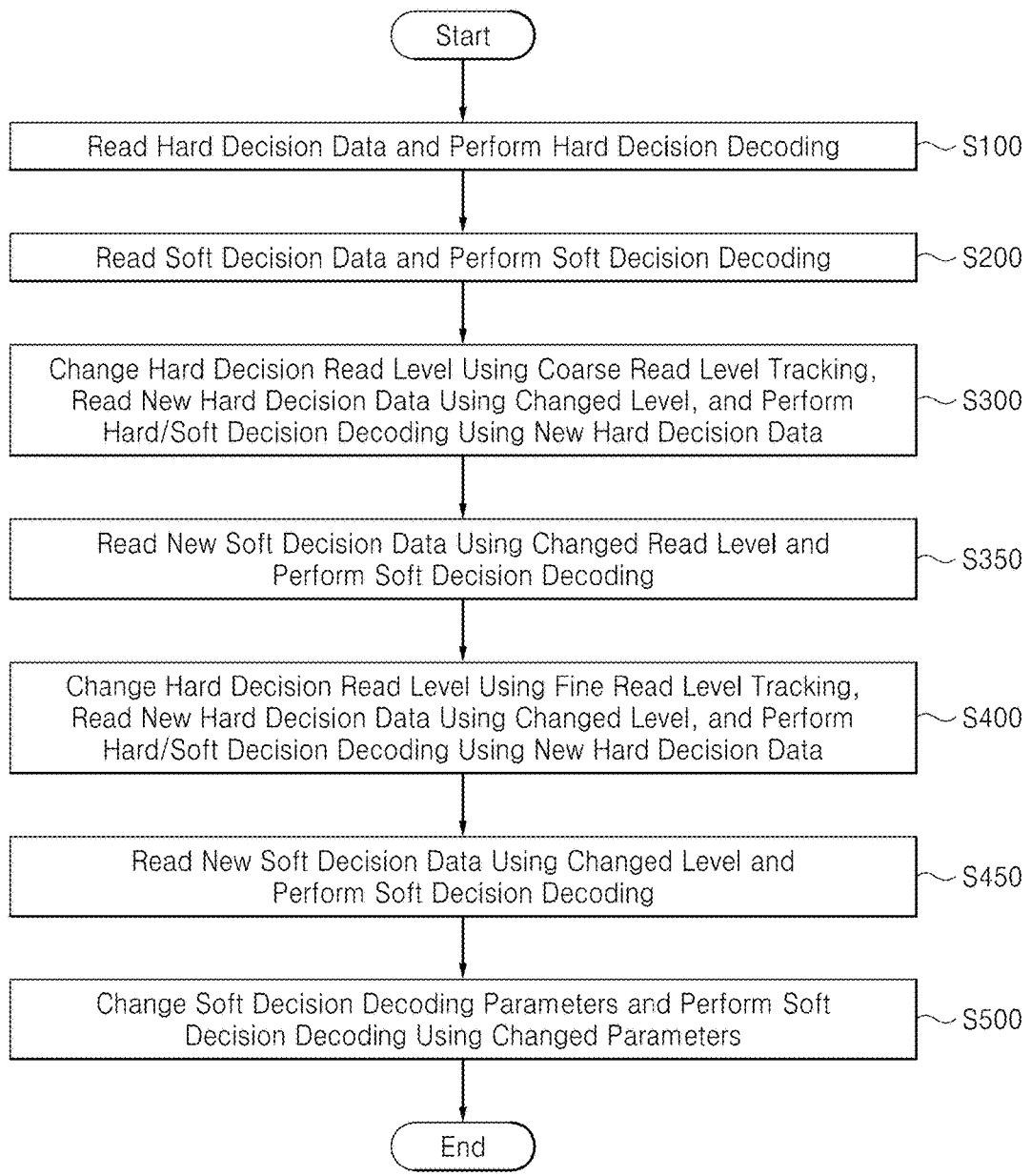

FIG. 9C is a flowchart of a data decoding method according to still other exemplary embodiments. The data decoding method illustrated in FIG. 9C further includes a fifth decoding operation, i.e., operation S500, as compared to the data decoding method illustrated in FIG. 9B.

In the fifth decoding operation S500, soft decision decoding parameters are changed and then soft decision decoding is performed using the changed soft decision decoding parameters. In some exemplary embodiments, parameters of an ECC decoder that performs soft decision decoding are changed and decoding is performed again. The ECC decoder may be a decoder that operates at an N-bit quantization level. In this case, the quantization level may be sequentially increased and soft decision decoding may be performed each time the quantization level is increased. The increase of the quantization level means the increase of the number of read levels for soft decision. As the quantization level increases, more soft decision data is obtained when data is read from flash memory, so that the error correction performance of soft decision decoding is increased.

In other exemplary embodiments, various soft decision offset sets corresponding to predefined degraded distributions of flash memory may be prepared and soft decision data may be read each time a soft decision offset is changed during decoding until the decoding succeeds in the fifth decoding operation S500. The error correction performance of decoding is increased by using an optimum soft decision offset for a particular distribution rather than using only one soft decision offset for all degraded distributions of flash memory.

Figure 9D:
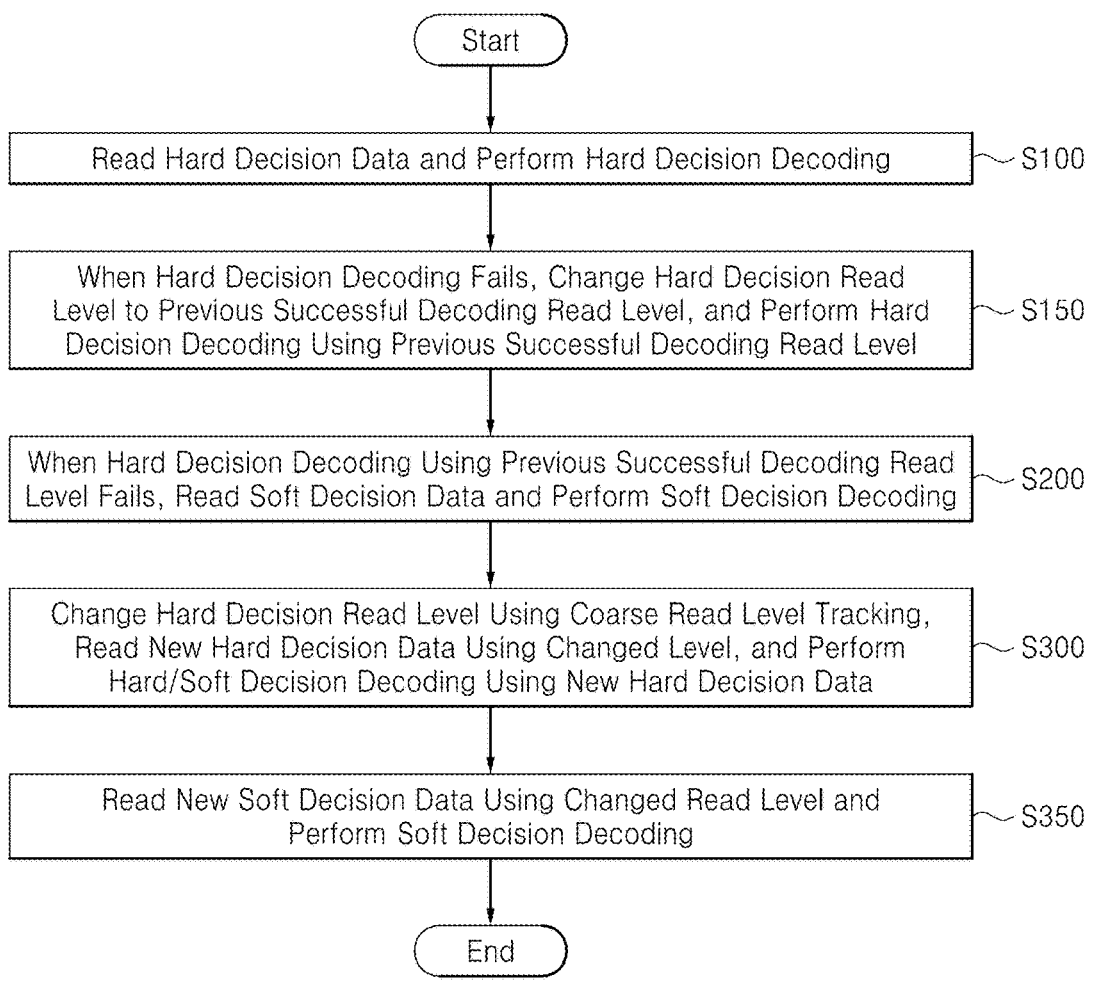

FIG. 9D is a flowchart of a data decoding method according to even other exemplary embodiments. The data decoding method illustrated in FIG. 9D further includes operation S150 as compared to the data decoding method illustrated in FIG. 9A. A hard decision read level used in previous successful decoding is used to obtain hard decision data and hard decision decoding is performed in operation S150.

Hard decision data may be read using a hard decision read level and hard decision decoding may be performed using the read hard decision data in operation S100. The hard decision read level used in operation S100 may be a basic read level or a reference read level. When hard decision decoding using the reference read level fails, a new hard decision read level that is different than the reference hard decision read level is used in operation S150 to obtain new hard decision data. The new hard decision read level may be a "previous successful decoding read level" that has been used in previous successful decoding. The previous successful decoding read level may be a hard decision read level that has been used in the latest successful decoding of the entire area of flash memory or a hard decision read level that has been stored at successful decoding of a data block. Alternatively, a hard decision read level used for successful decoding of a page may be used as the previous successful decoding read level. For this operation, a hard decision read level at successful decoding of entire flash memory or certain region (e.g., each data block or each page) of the flash memory may be managed by a memory controller. The remaining operations are as previously described and a repeated description will not be provided, except that in operation S350 in FIG. 9D, the reference hard decision read level or the previous successful hard decision read level may be changed using coarse read level tracking.

Figure 9E:
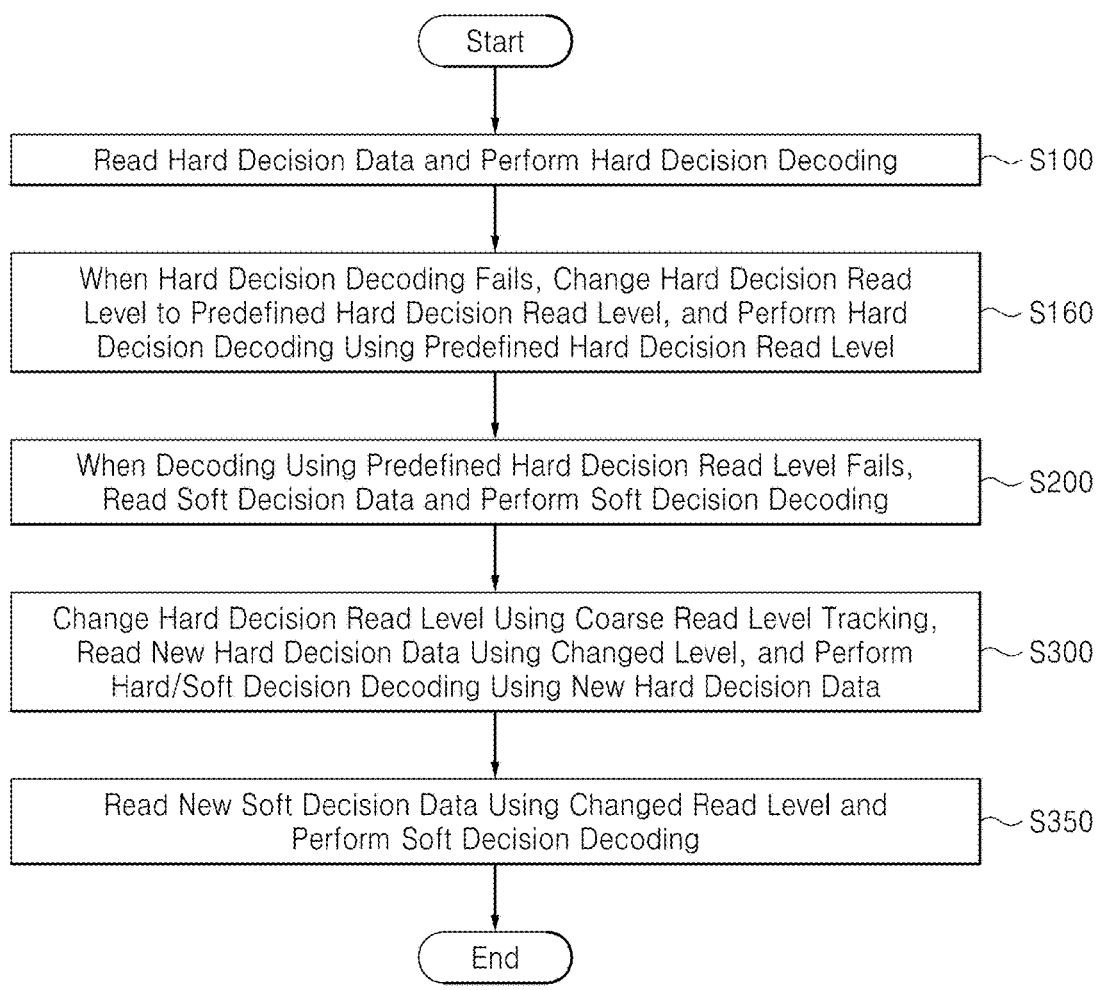

FIG. 9E is a flowchart of a data decoding method according to yet other exemplary embodiments. The data decoding method illustrated in FIG. 9E further includes operation S160 as compared to the data decoding method illustrated in FIG. 9A. Hard decision data may be obtained using one of at least one predefined hard decision read level and hard decision decoding may be performed using the hard decision data in operation S160. The at least one predefined hard decision read level may be preset depending on the degree of typical (e.g., most common or frequent) distribution degradation of the flash memory.

In detail, particular hard decision read levels corresponding to the most frequent degradation states are preset through testing of the flash memory. At least one hard decision read level is selected from the list of the preset hard decision read levels and used. The number of preset hard decision read levels may be one or more and is not limited to a certain number.

Reading is required to be performed a greater number of times to obtain soft decision data than to obtain hard decision data. Accordingly, a decoding time is effectively reduced when decoding is performed using hard decision data (which requires a fewer number of times of reading than soft decision data) that has been read using a varying hard decision read level in operation S150 in FIG. 9D or in operation S160 in FIG. 9E before proceeding to operation S200, in which soft decision data is obtained by performing additional reading, in case where decoding performed using hard decision data obtained at the reference hard decision read level in operation S100 fails.

Figure 9F:
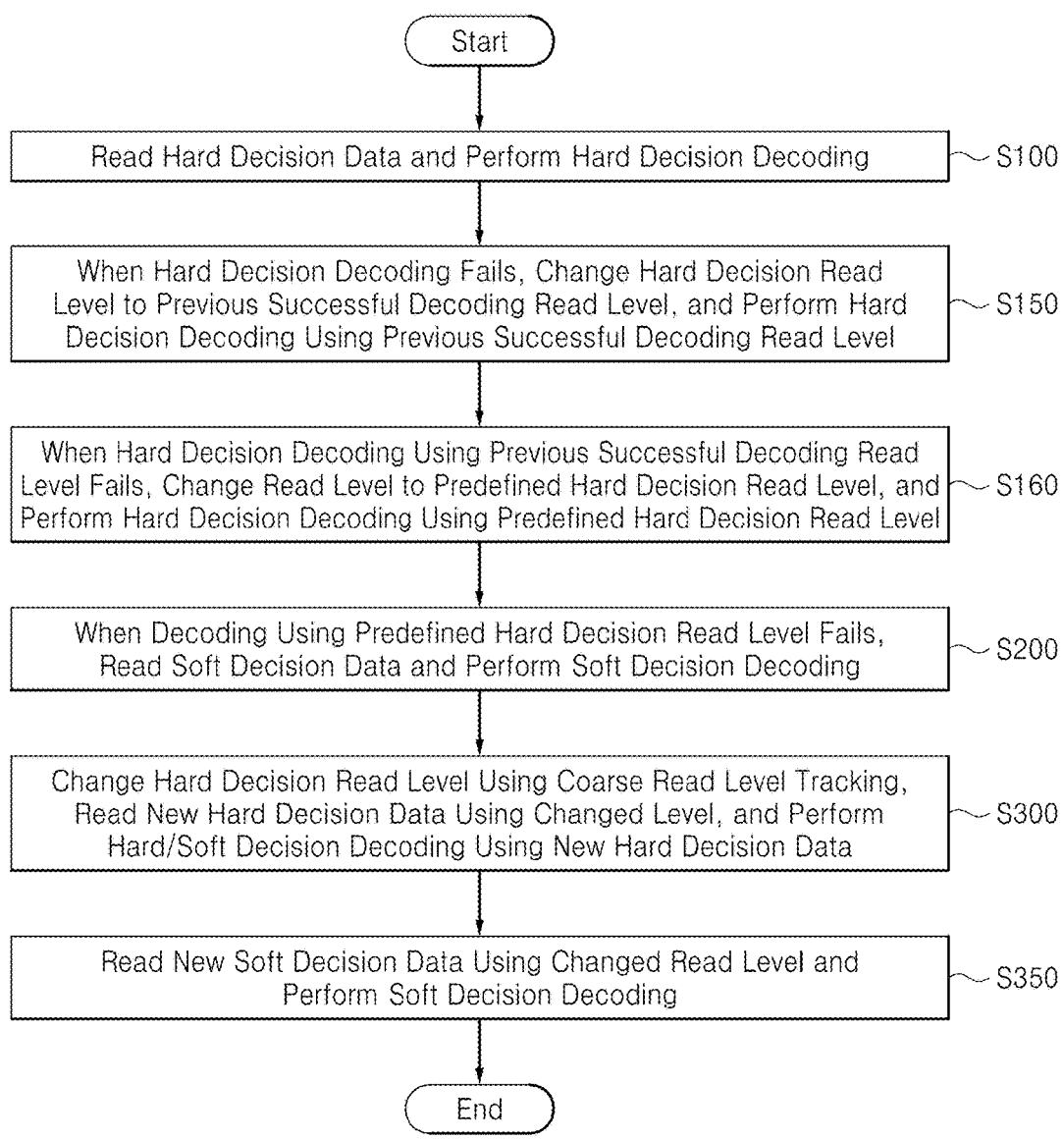

FIG. 9F is a flowchart of a data decoding method according to further exemplary embodiments. The data decoding method illustrated in FIG. 9F further includes operation S160 as compared to the data decoding method illustrated in FIG. 9D. In other words, in the data decoding method illustrated in FIG. 9F, operation S150 illustrated in FIG. 9D and operation S160 illustrated in FIG. 9E may be inserted between the first decoding operation S100 and the second decoding operation S200.

In the data decoding method illustrated in FIG. 9F, when decoding fails in the first decoding operation S100, new hard decision data may be read using a hard decision read level that has been used in previous successful decoding and hard decision decoding may be performed using the hard decision data in operation S150. When decoding fails in operation S150, new hard decision data may be read using at least one predefined hard decision read level and hard decision decoding may be performed using the hard decision data in operation S160. When decoding fails in operation S160, the method may proceed to the second decoding operation S200.

Figure 9G:
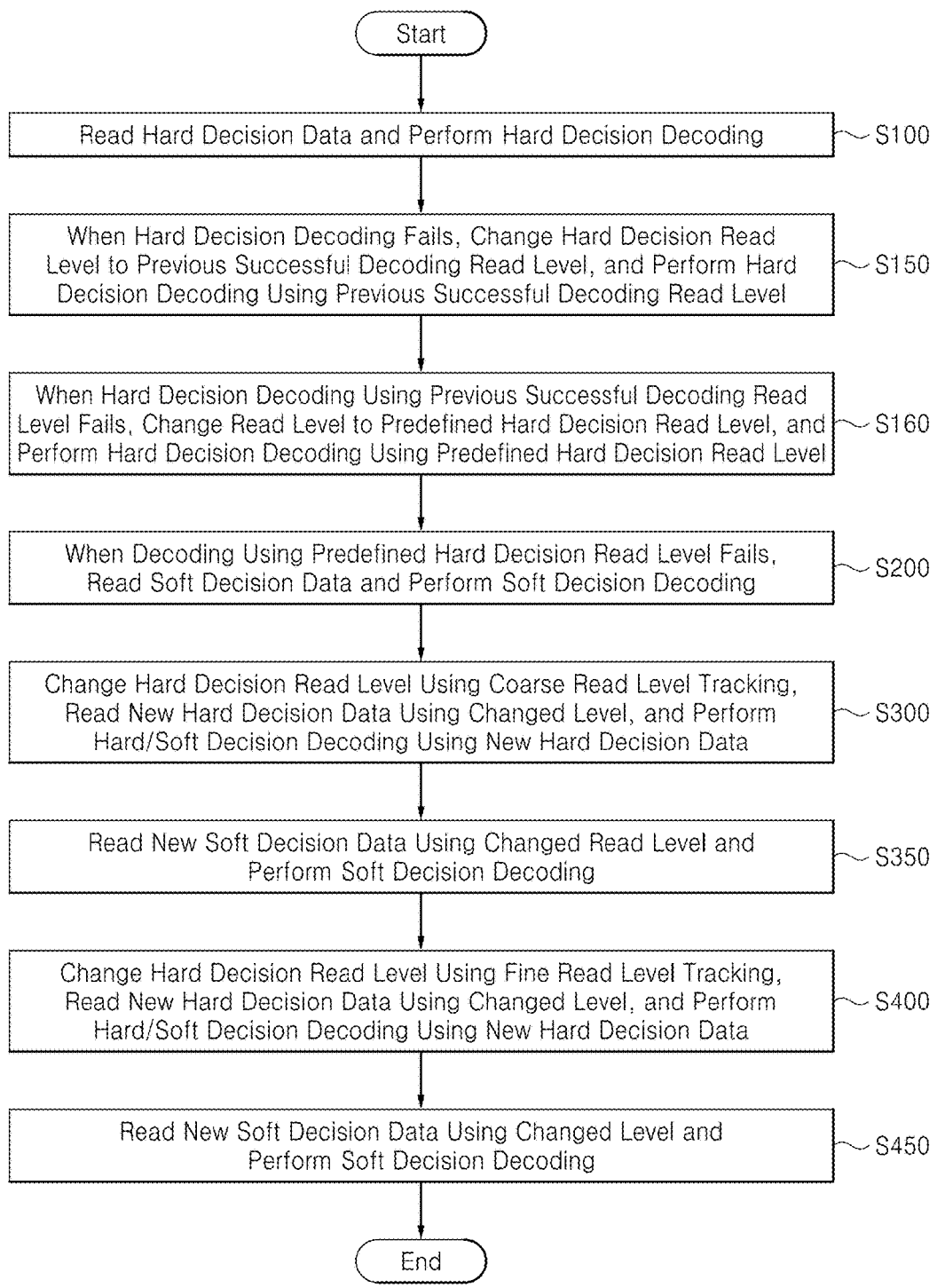

FIG. 9G is a flowchart of a data decoding method according to still further exemplary embodiments. The data decoding method illustrated in FIG. 9G further includes operations S150 and S160 as compared to the data decoding method illustrated in FIG. 9B. In other words, operations S150 and S160 may be inserted between the first decoding operation S100 and the second decoding operation S200 in the data decoding method illustrated in FIG. 9G like the method illustrated in FIG. 9F.

Figure 9H:
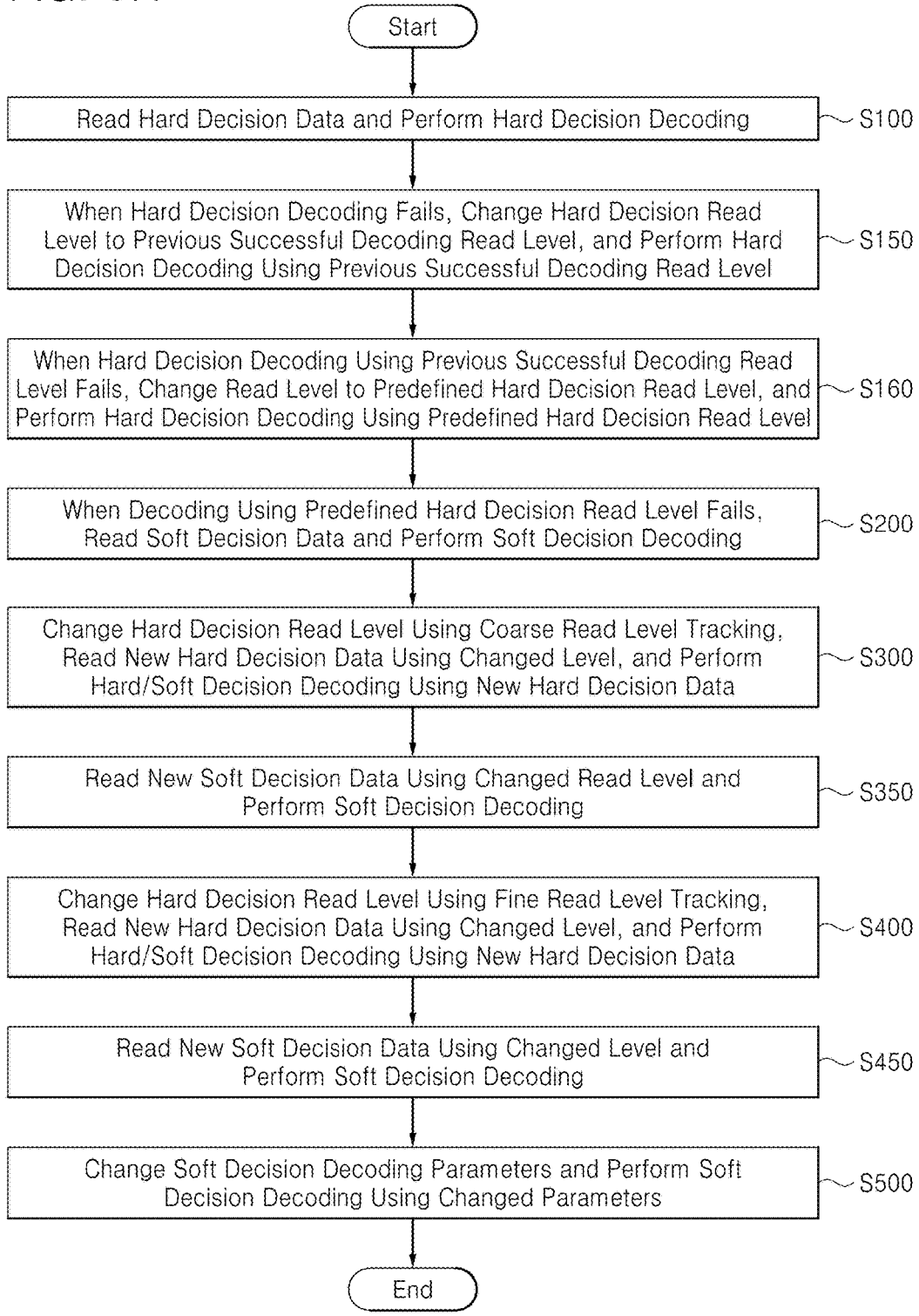

FIG. 9H is a flowchart of a data decoding method according to even further exemplary embodiments. The data decoding method illustrated in FIG. 9H further includes operations S150 and S160 as compared to the data decoding method illustrated in FIG. 9C. In other words, operations S150 and S160 may be inserted between the first decoding operation S100 and the second decoding operation S200 in the data decoding method illustrated in FIG. 9H as in the methods illustrated in FIGS. 9F and 9G.

Figure 9I:
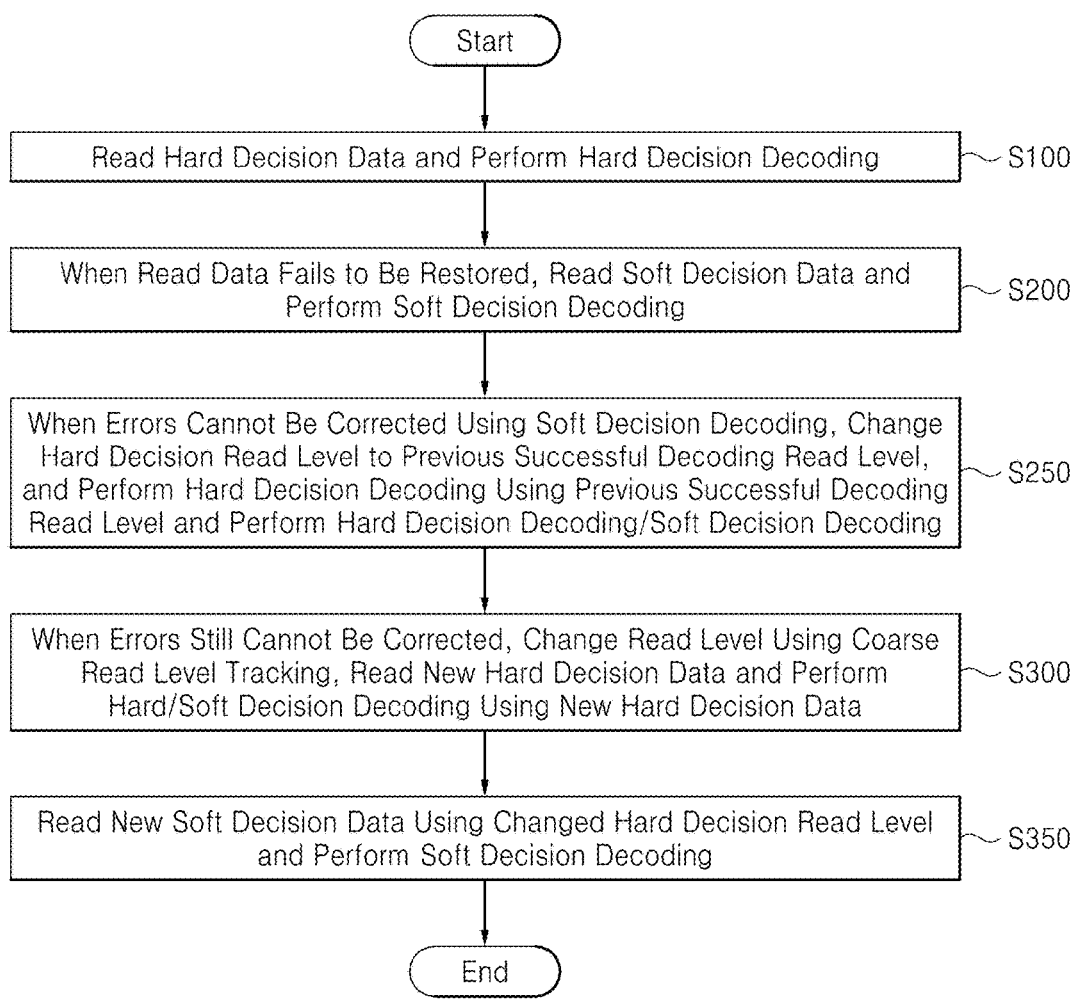

FIG. 9I is a flowchart of a data decoding method according to yet further exemplary embodiments. The data decoding method illustrated in FIG. 9I further includes operation S250 as compared to the data decoding method illustrated in FIG. 9A.

Referring to FIG. 9I, after the second decoding operation S200, hard decision data may be obtained using a previous successful decoding read level and hard decision decoding may be performed using the hard decision data and when the hard decision decoding fails, soft decision data may be additionally read and soft decision decoding may be performed using the soft decision data in operation S250.

Operation S250 is similar to operation S150, but it is performed after the second decoding operation S200. The previous successful decoding read level used in operation S250 may include a hard decision read level or a pair of a hard decision read level and a soft decision read level (or a soft decision offset).

Alternatively, instead of additionally performing soft decision decoding when hard decision decoding fails, hard decision data and soft decision data may be read using a previous successful decoding read level (i.e., a hard decision read level and a soft decision read level) and only soft decision decoding may be performed in operation S250.

A hard decision read level and a soft decision read level that have been used in previous successful decoding are stored and used as new read levels in operation S250. The hard decision and soft decision read levels used in previous successful decoding may be hard decision and soft decision read levels that have been used in the latest successful decoding of the entire area of flash memory or hard decision and soft decision read levels that have been stored at successful decoding of a data block. Alternatively, hard decision and soft decision read levels used for successful decoding of a page may be used. For this operation, hard decision and soft decision read levels at successful decoding of entire flash memory or certain region (e.g., each data block or each page) of the flash memory may be managed by a memory controller.

Figure 9J:
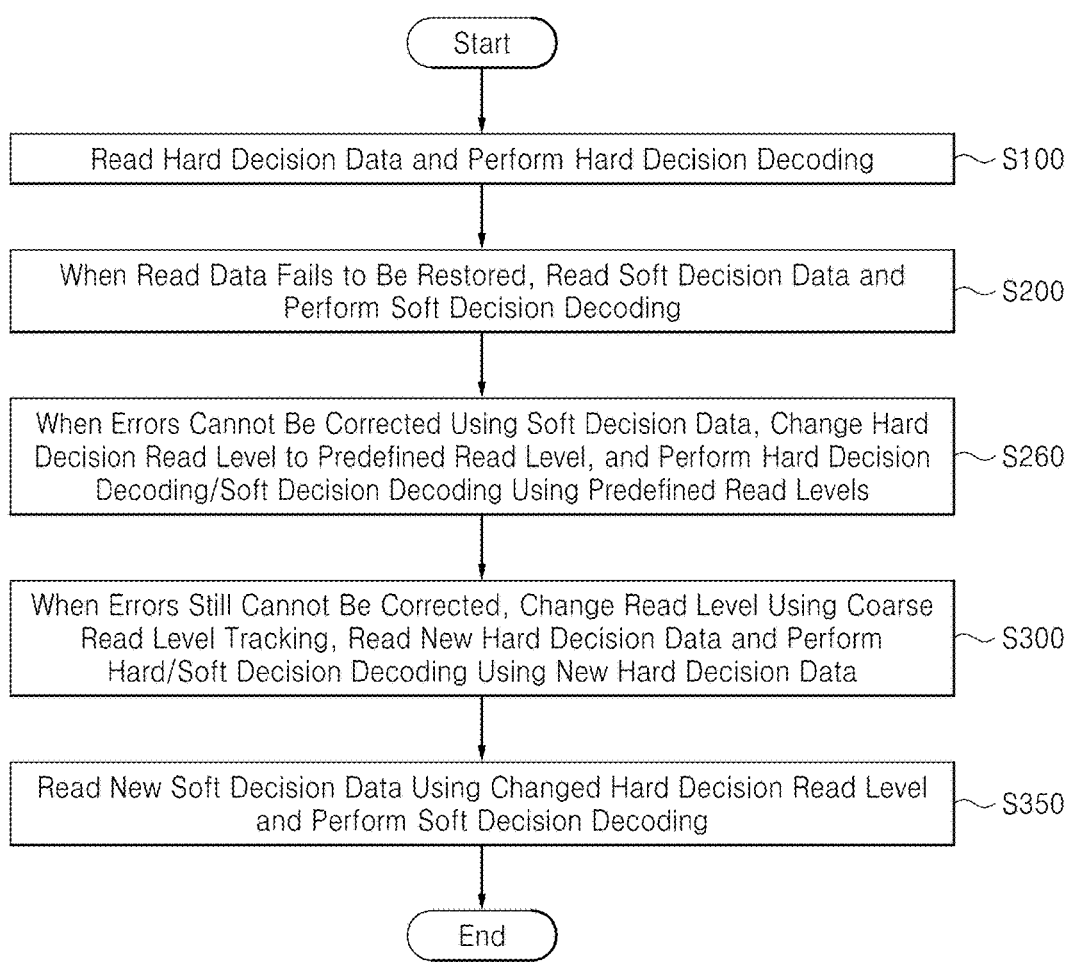

FIG. 9J is a flowchart of a data decoding method according to other exemplary embodiments. The data decoding method illustrated in FIG. 9J further includes operation S260 as compared to the data decoding method illustrated in FIG. 9A.

Referring to FIG. 9J, after the second decoding operation S200, hard decision data may be obtained using one of at least one predefined read level and hard decision decoding may be performed using the hard decision data and, when the hard decision decoding fails, soft decision data may be additionally read and soft decision decoding may be performed in operation S260. The at least one predefined read level may include at least one hard decision read level or a pair of a hard decision read level and a soft decision read level (or a soft decision offset). The at least one predefined read level may be preset depending on the most frequent degradation states through the test of flash memory. Operation S260 is similar to operation S160, but it is performed after the second decoding operation S200.

Alternatively, instead of additionally performing soft decision decoding when hard decision decoding fails, hard decision data and soft decision data may be read using a pair of a predefined hard decision read level and a soft decision read level (or a soft decision offset) and only soft decision decoding may be performed in operation S260.

Figure 9K:
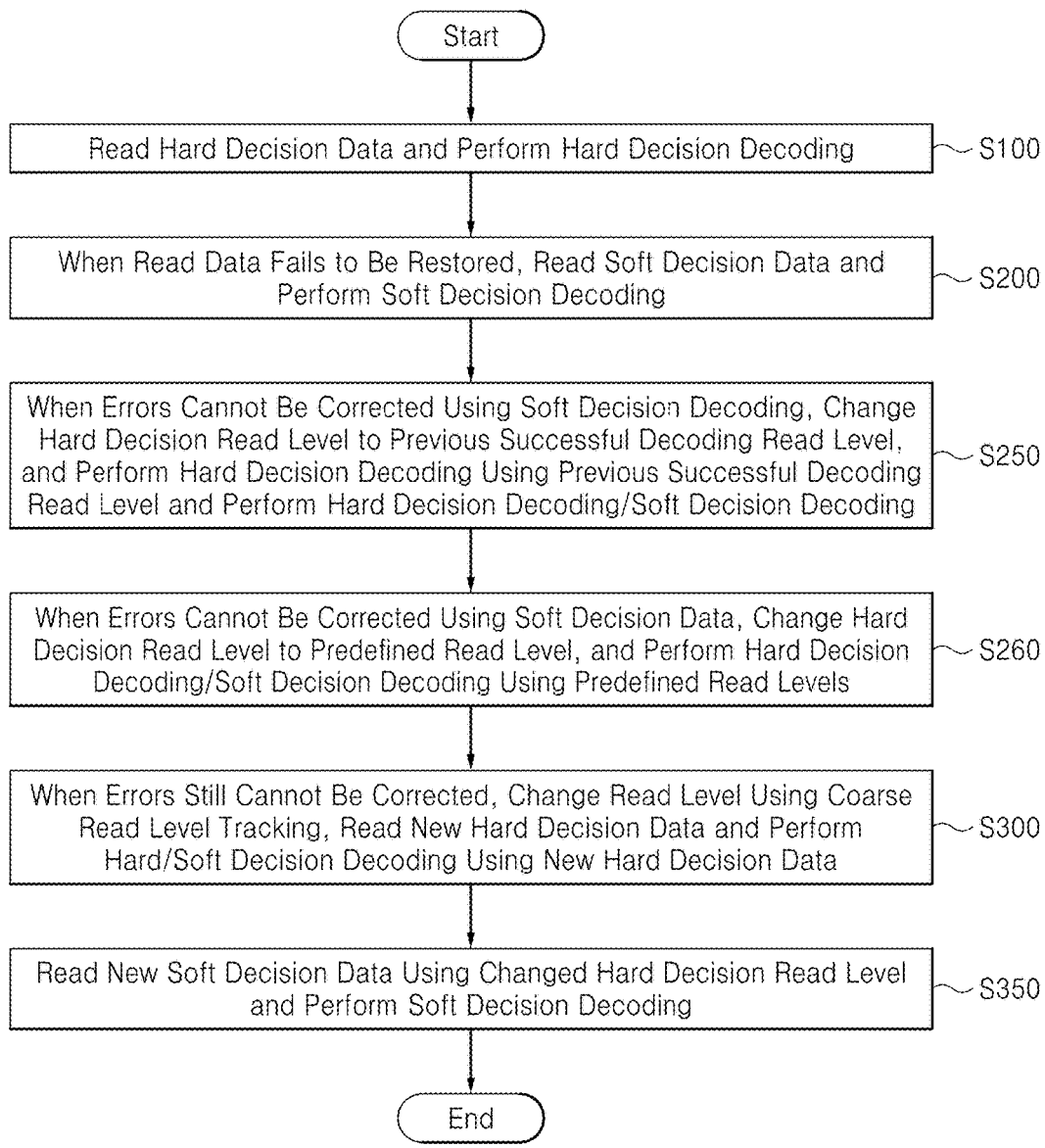

FIG. 9K is a flowchart of a data decoding method according to still other exemplary embodiments. The data decoding method illustrated in FIG. 9K further includes operation S260 as compared to the data decoding method illustrated in FIG. 9I. In other words, operation S250 illustrated in FIG. 9I and operation S260 illustrated in FIG. 9J may be inserted between the second decoding operation S200 and the third first decoding operation S300 in the data decoding method illustrated in FIG. 9K.

Referring to FIG. 9K, when decoding fails in the second decoding operation S200, new hard decision data may be read using a hard decision read level used in previous successful decoding and hard decision decoding may be performed using the hard decision data and, when the hard decision decoding fails, soft decision decoding may be performed using a soft decision read level in operation S250. When the decoding fails in operation S250, new hard decision data may be read using at least one predefined hard decision read level and hard decision decoding may be performed using the hard decision data and, when the hard decision decoding fails, soft decision data may be additionally read and soft decision decoding may be performed in operation S260. When the decoding fails in operation S260, the method proceeds to the third first decoding operation S300.

Figure 9L:
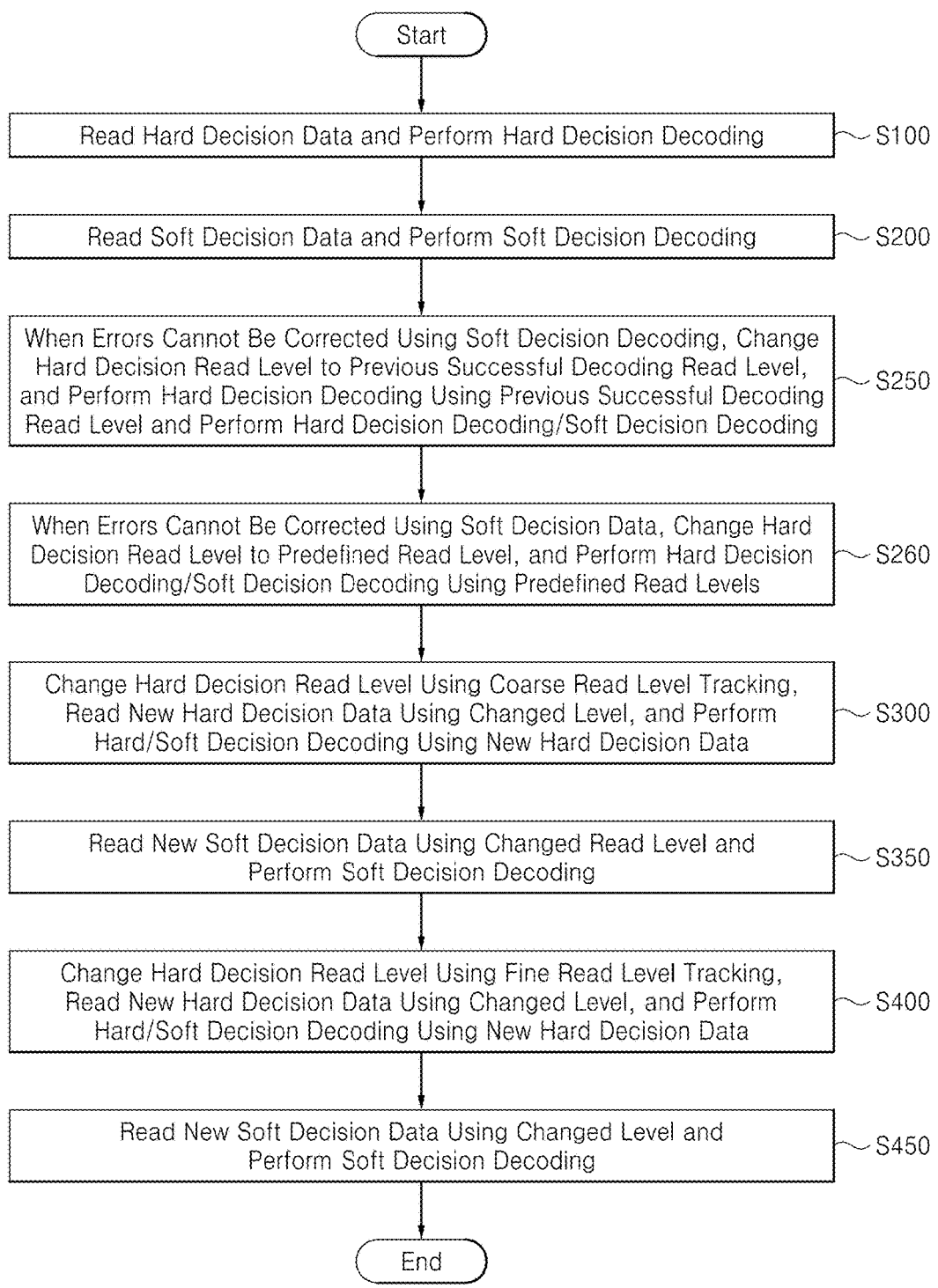

FIG. 9L is a flowchart of a data decoding method according to even other exemplary embodiments. The data decoding method illustrated in FIG. 9L further includes operations S250 and S260 as compared to the data decoding method illustrated in FIG. 9B. In other words, operations S250 and S260 may be inserted between the second decoding operation S200 and the third first decoding operation S300 in the data decoding method illustrated in FIG. 9L as in the method illustrated in FIG. 9K.

Figure 9M:
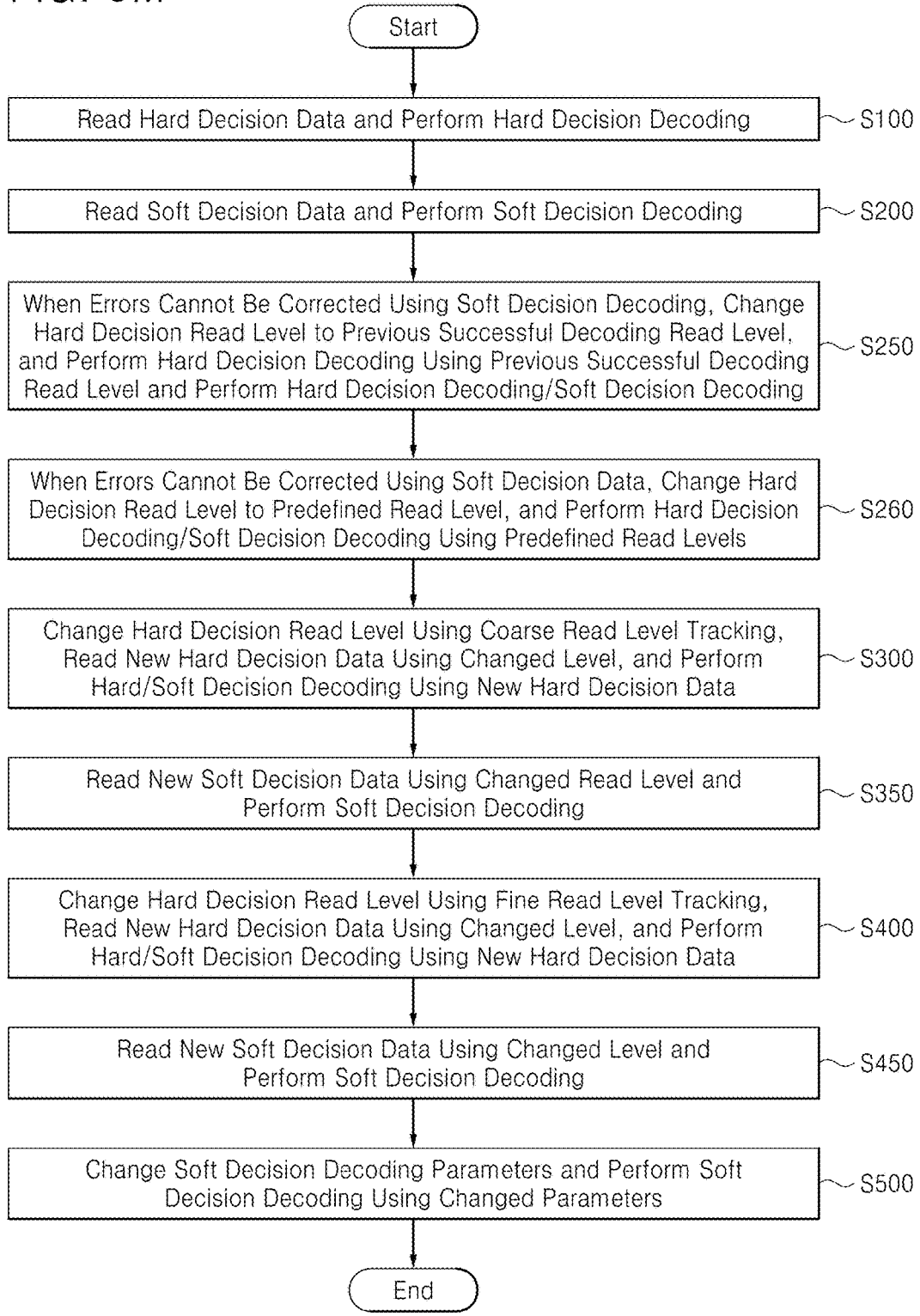

FIG. 9M is a flowchart of a data decoding method according to yet other exemplary embodiments. The data decoding method illustrated in FIG. 9M further includes operations S250 and S260 as compared to the data decoding method illustrated in FIG. 9C. In other words, operations S250 and S260 may be inserted between the second decoding operation S200 and the third first decoding operation S300 in the data decoding method illustrated in FIG. 9M as in the methods illustrated in FIGS. 9K and 9L.

As described above, operations S150 and S250 are provided to increase a decoding success probability by using previous successful decoding read levels to read new data when decoding fails, and operations S160 and S260 are provided to increase the decoding success probability by using read levels that have been set to be appropriate for the most frequent degradation states through the test of flash memory in advance.

Consequently, according to some exemplary embodiments, a plurality of operations with different decoding performance (i.e., error correction performance) and different decoding time (i.e., data restoration time) are provided so that decoding is performed with optimum read performance and data reliability. A type of data read from the flash memory 200, a method of correcting errors, and a read level tracking technique may be appropriately selected and determined in each operation according to the memory system using flash memory.

Decoding operations may be configured as shown in the flowcharts illustrated in FIGS. 9A through 9M, but these configurations are just examples. Individual decoding operations illustrated in FIGS. 9A through 9M may be combined in different configurations.

FIGS. 10A through 10D are detailed flowcharts of the operations in a data decoding method according to some exemplary embodiments.

Figure 10A:
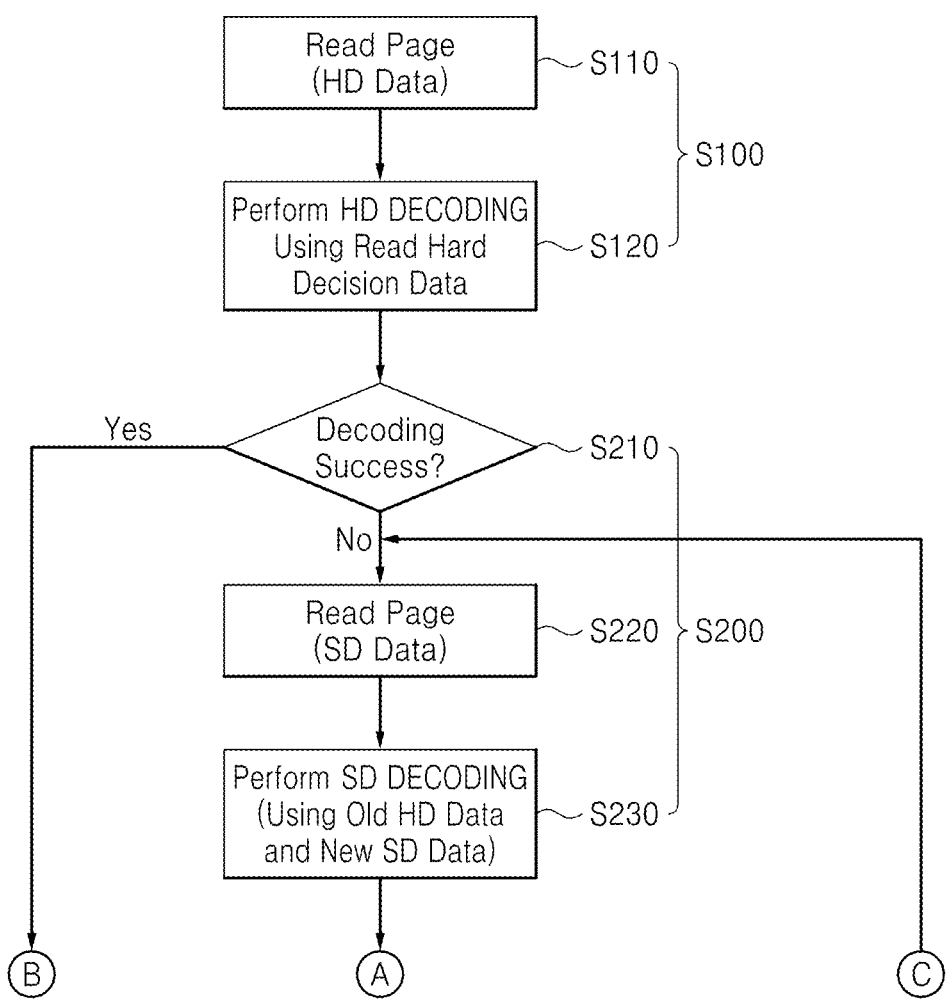

FIG. 10A is a detailed flowchart of the first and second decoding operations S100 and S200 illustrated in FIGS. 9A through 9C. Referring to FIGS. 1 through 10A, the first decoding operation S100 may include reading hard decision data in operation S110 and performing decoding using the hard decision data in operation S120. The readout performance of the non-volatile memory system 20 is given priority in the first decoding operation S100.

FIGS. 11A and 11B are diagrams showing the distributions of memory cells and a hard decision read level VHD1 to explain hard decision data reading. Referring to FIGS. 11A and 11B, hard decision (HD) data is a result of determining data stored in a memory cell as "0" or "1" using a single reference voltage level. The single reference voltage level may be, for example, an HD read level VHD1. For instance, the HD read level VHD1 may be applied to a word line connected to a current memory cell and a pass voltage may be applied to the other word lines and then data of the current memory cell may be determined as "0" or "1" depending on existence or non-existence of current in a bit line connected to the memory cell. Although just two adjacent distributions are illustrated in FIGS. 11A and 11B, the number of distributions may vary. The adjacent distributions may correspond to an erased state and a programmed state or different programmed states, respectively. As described above, data read using a single read level to distinguish adjacent distributions from each other may be referred to as hard decision (HD) data.

The ECC decoder 152 may correct errors using soft decision data and may also correct errors using only HD data. The ECC decoder 152 shows lower error correction performance when using only HD data than when using soft decision data. However, the non-volatile memory 200 is usually in such a good state during the initial use (i.e., an initial stage in the life) of the non-volatile memory system 20 that data read from the non-volatile memory 200 does not have many errors.

It takes more time to obtain HD data than to obtain soft decision data in the non-volatile memory system 20. Accordingly, if decoding is performed using soft decision data in the first decoding operation S100, the readout performance of the non-volatile memory system 20 drops from the initial use. Therefore, according to some exemplary embodiments, only HD data is read and used for decoding in the first decoding operation S100.

Referring back to FIG. 10A, the method proceeds to the second decoding operation S200 when data fails to be restored in the first decoding operation S100 (i.e., in case of NO in operation S210). The second decoding operation S200 may include reading soft decision (SD) data in operation S220 and performing decoding using the soft decision (SD) data in operation S230.

After the first decoding operation S100, success or failure of the decoding is determined in operation S210. When the success of the decoding is determined (i.e., in case of YES) in operation S210, the method ends in decoding success in operation S710 illustrated in FIG. 10D. However, when the failure of the decoding in the first decoding operation S100 is determined, that is, when data errors fail to be corrected (i.e., in case of NO in operation S210), soft decision data is read in operation S220.

Figure 12:
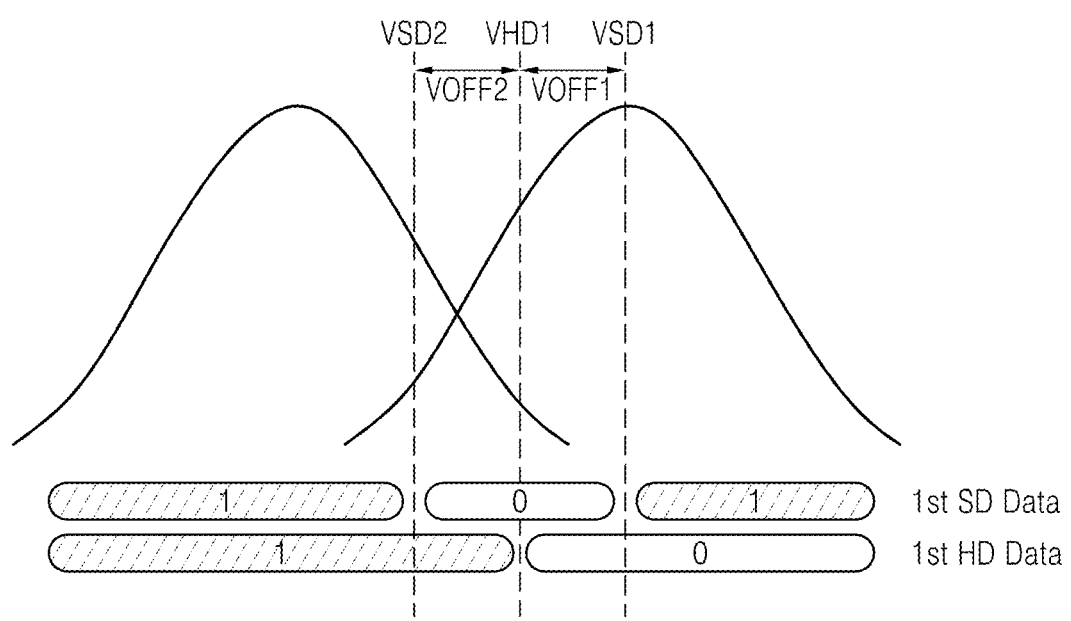
FIG. 12 is a diagram for explaining soft decision data reading.

FIG. 12 is a diagram showing distributions of memory cells and soft decision read levels VSD1 and VSD2 to explain soft decision data reading. Soft decision data is obtained by reading data from memory cells using the first soft decision read level VSD1 and the second soft decision read level VSD2. The first soft decision read level VSD1 and the second soft decision read level VSD2 may have first soft decision offset VOFF1 and second soft decision offset VOFF2, respectively, from the HD read level VHD1. For instance, the first soft decision read level VSD1 is the HD read level VHD1 plus the first soft decision offset VOFF1 and the second soft decision read level VSD2 is the HD read level VHD1 less the second soft decision offset VOFF2. The first soft decision offset VOFF1 and the second soft decision offset VOFF2 may be preset and may be the same as or different from each other. Returning to FIG. 10A, in operation S230, the soft decision decoding is performed using both the soft decision (SD) data read from the flash memory 200 in operation S220 and the HD data read in operation S110.

The SD data read from the non-volatile memory 200 in the second decoding operation S200 indicates the reliability of HD data read before. Data in a certain area around a HD read level is in a section in which adjacent distributions overlap each other and the probability that errors occur during HD reading is expected to be high. Accordingly, a particular range around the HD read level is defined by the first SD offset VOFF1 and the second SD offset VOFF2, and the SD data indicates that HD data within the particular range has lower reliability that HD data out of the particular range.

As the usage time of the non-volatile memory system 20 increases, that is, as the number of times of writing and reading increases, the number of errors in data read from the non-volatile memory system 20 increases due to the degradation of the non-volatile memory 200. Accordingly, it is highly likely that errors that have not been corrected with a decoding method (hereinafter, referred to as "HD decoding") using HD data in the first decoding operation S100, will be corrected with a decoding method (hereinafter, referred to as "SD decoding) using SD data in the second decoding operation S200.

FIG. 10B is a detailed flowchart of the third decoding operation S300 illustrated in FIGS. 9A through 9M. The third decoding operation S300 is entered when the state of flash memory is degraded so much that errors in data cannot be corrected even with SD decoding.

Referring back to FIGS. 11A and 11B, FIG. 11A shows the distributions in an initial state of the flash memory. As shown in FIG. 11A, a default read level (e.g., the first HD read level VHD1) is at the middle between the left and right distributions, which have similar shapes to each other, in the initial state of the flash memory. FIG. 11B shows programmed distributions changed due to the degradation of the flash memory. When the position of a valley between the distributions is displaced from the default read level, e.g., the first HD read level VHD1, due to degradation of the flash memory as shown in FIG. 11B, data read using the default read level, e.g., the first HD read level VHD1, has a greater number of errors. Consequently, when the shape of distributions changes as shown in FIG. 11B, expected error correction performance may not be realized even with SD decoding.

Accordingly, it will be helpful in correcting errors if a read level is tracked (S330) and a HD read level is changed (S340) in the third decoding operation S300. For instance, a valley between distributions (i.e., a level at which two distributions intersect) is tracked in operation S330 and the HD read level is changed to the tracked level in operation S340.

There may be various ways of tracking a read level. A coarse read level tracking technique for maximizing error correction performance and minimizing readout performance degradation is used in the current exemplary embodiments. The coarse read level tracking technique used in the third decoding operation S300 is a method that enables a read level to be tracked without an additional reading operation for read level tracking. An example of this method is disclosed in Korean Patent Application No. 10-2013-0004037, and the disclosure of Korean Patent Application No. 10-2013-0004037 is hereby incorporated by reference in its entirety.

Figure 13:
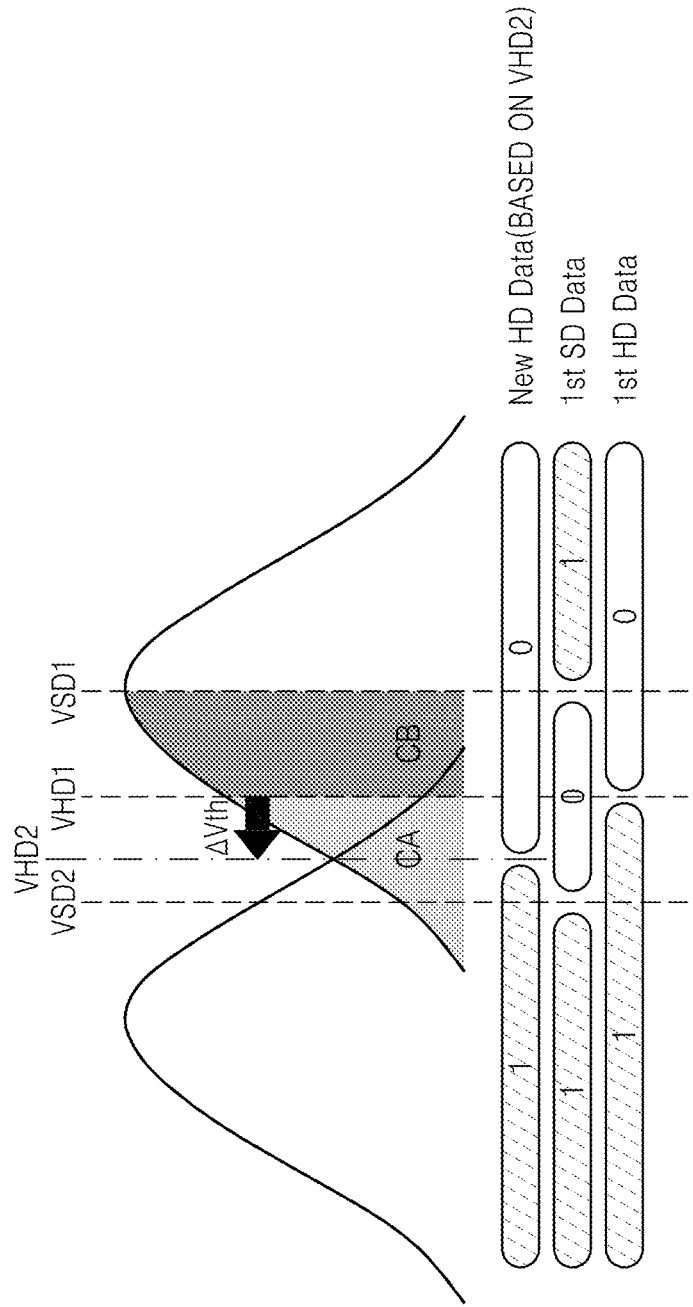
FIG. 13 is a graph for explaining a coarse read level tracking method according to some exemplary embodiments.

FIG. 13 is a graph for explaining a coarse read level tracking method according to some exemplary embodiments. Referring to FIG. 13, the HD data has been obtained by reading data on the basis of the first HD read level VHD1 in the first decoding operation S100 and the SD data has been obtained by performing additional data reading after shifting from the first HD read level VHD1 by a predefined interval (i.e., SD offset) in the second decoding operation S200. The number of memory cells in a section CA and the number of memory cells in a section CB may be obtained by performing an appropriate operation on the HD data obtained in the first decoding operation S100 and the SD data obtained in the second decoding operation S200.

For instance, the section CA corresponds to a group of memory cells whose HD data read using the first HD read level VHD1 is "1" and whose SD data read using the first SD read level VSD1 and the second SD read level VSD2 is "0". The section CB corresponds to a group of memory cells whose HD data read using the first HD read level VHD1 and SD data read using the first SD read level VSD1 and the second SD read level VSD2 are both "0".

The degree of distribution degradation of flash memory can be roughly estimated using the number of memory cells in the section CA and the number of memory cells in the section CB. A method of roughly finding a read level based on the estimated value of the distribution degradation is the coarse read level tracking method illustrated in FIG. 13. A distribution variation $\Delta V$th may be calculated using the following Equation:

$$\Delta V\text{th} = \alpha(nCB - nCA) + \beta,$$

where $\alpha$ and $\beta$ are constants, nCB is the number of memory cells in the section CB, and nCA is the number of memory cells in the section CA. The constants $\alpha$ and $\beta$ may have predetermined values.

Figure 14:
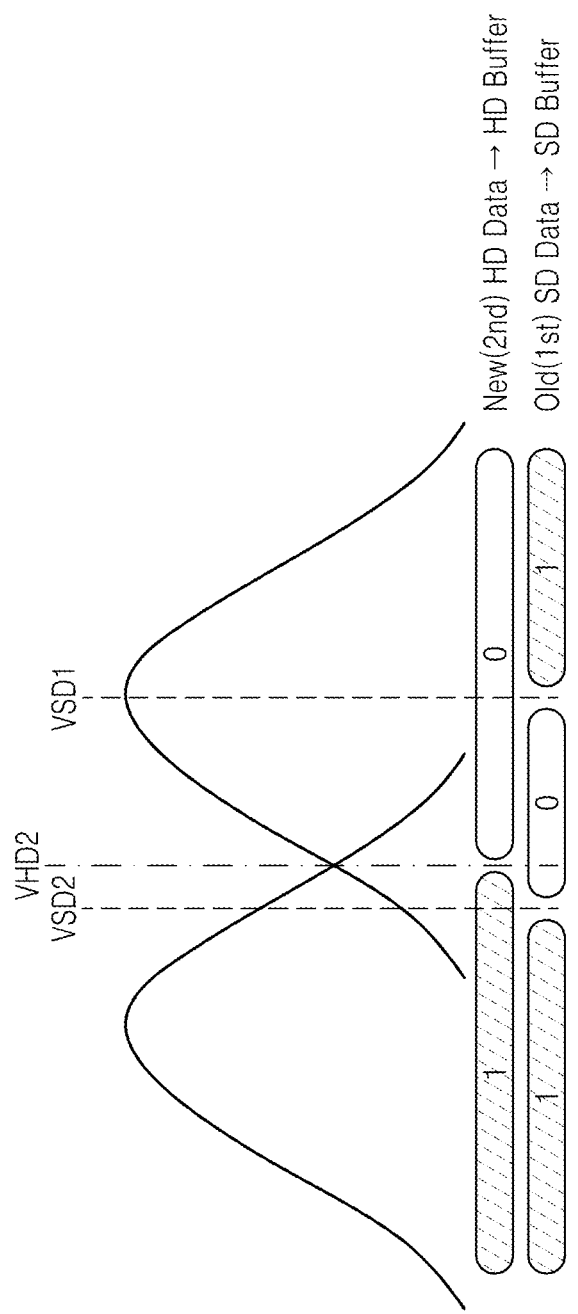
FIG. 14 is a diagram for explaining a new hard decision read level set by the coarse read level tracking illustrated in FIG. 13 and explaining data reading using the new hard decision read level.

Returning to FIG. 10B, a position of the valley between the distributions, which has been estimated through the coarse read level tracking, is set as a new HD read level (hereinafter, referred to as a second HD read level) VHD2 in operations S330 and S340 and HD data is read using the second HD read level VHD2 in operation S360, as shown in FIG. 14. The second HD read level VHD2 may be the first HD read level VHD1 less the distribution variation $\Delta V$th, as shown in FIG. 13. In some exemplary embodiments, a difference between the second HD read level VHD2 and the first HD read level VHD1, i.e., the distribution variation $\Delta V$th, may be compared with a minimum variation Min_delta in order to find out whether the distribution variation $\Delta V$th is less than the minimum variation Min_delta in operation S350. The minimum variation Min_delta may be predetermined. When the distribution variation $\Delta V$th is less than the minimum variation Min_delta (i.e., in case of YES in operation S350), the method proceeds to the next decoding operation, i.e., the fourth decoding operation S400. When the distribution variation $\Delta V$th is greater than or equal to the minimum variation Min_delta (i.e., in case of NO in operation S350), the HD data may be read using the second HD read level VHD2 in operation S360.

Thereafter, decoding is performed using new HD data in operations S385 and S380. At this time, HD decoding may be performed using only the new HD data in operation S385 or SD decoding may be performed using both new HD data and old SD data together in operation S380. Since the old SD data that has been read before is used for the SD decoding in operation S380, error correction performance is increased without additional data reading.

It may happen that the value between distributions is not shifted much from the first HD read level VHD1 used in the first decoding operation S100. When a new HD read level, i.e., the second HD read level VHD2 that has been found through the coarse read level tracking, is within a predefined range from the first HD read level VHD1 (i.e., in case of YES in operation S370); the old (or first) SD data read before may be regarded as representing the reliability of the HD data read using the second HD read level VHD2. In this case, SD decoding may be performed using the old (or first) SD data, as shown in FIG. 13, in operation S380. More errors can be corrected when SD decoding is performed than when HD decoding is performed. Accordingly, if the old SD data is meaningful, decoding is more likely successful when SD decoding is performed using old data than when decoding is performed using the new HD data only.

However, when the new HD read level, i.e., the second HD read level VHD2 that has been found through the coarse read level tracking, is out of the predefined range from the first HD read level VHD1 (i.e., in case of NO in operation S370) due to significant distribution degradation; the old SD data cannot represent the reliability of the HD data read using the second HD read level VHD2. In such a case, SD decoding cannot be performed using the old SD data. At this time, HD decoding is performed using only the new HD data for error correction in operation S385.

When the decoding performed in operation S380 or S385 is successful (i.e., in case of YES in operation S390), the method ends in decoding success in operation S710. However, when the decoding performed in operation S380 or S385 fails, that is, when errors in data fail to be corrected (i.e., in case of NO in operation S390); a new SD read level is set based on the second HD read level VHD2 in operation S395, and new SD data is read in operation S220. At this time, third and fourth SD offsets may be the same as or different from the first SD offset VOFF1 and the second SD offset VOFF2. New SD data, i.e., second SD data obtained using new SD read levels, is used together with second HD data read using the second HD read level VHD2 to perform SD decoding in operation S230.

When decoding fails even when HD or SD decoding is performed using an HD read level found through the coarse read level tracking in the third decoding operation S300, in some exemplary embodiments the coarse read level tracking and HD or SD decoding may be repeatedly performed until decoding succeeds. The coarse read level tracking may be repeated up to a predetermined maximum count Max_loop. In this case, a coarse search count is compared with the maximum count Max_loop to find out whether the coarse search count is greater than the maximum count Max_loop in operation S320. When the coarse search count is greater than the maximum count Max_loop (i.e., in case of YES in operation S320), the method proceeds to the fourth decoding operation S400. When the coarse search count is less than or equal to the maximum count Max_loop (i.e., in case of NO in operation S320), the coarse read level tracking is performed in operation S330. The coarse search count is information indicating the number of repetitions of coarse read level tracking.

The method goes back to the previous decoding operation, i.e., the second decoding operation S200, to repeatedly perform coarse read level tracking and decoding when the decoding performed in operation S380 or S385 is determined as a failure (i.e., in case of NO in operation S390) in the current exemplary embodiments. However, in other exemplary embodiments, when decoding fails after performing coarse read level tracking once, the method may proceed to the fourth decoding operation S400 without repeating the coarse read level tracking.

As described above, according to the current exemplary embodiments, at least one operation among a plurality of operations may be repeated. For instance, since distributions gradually shift as the non-volatile memory 200 becomes more degraded; coarse read level tracking, which enables a distribution variation to be estimated with reasonable accuracy even without additional data reading, may be repeated many times.

Figure 10C:
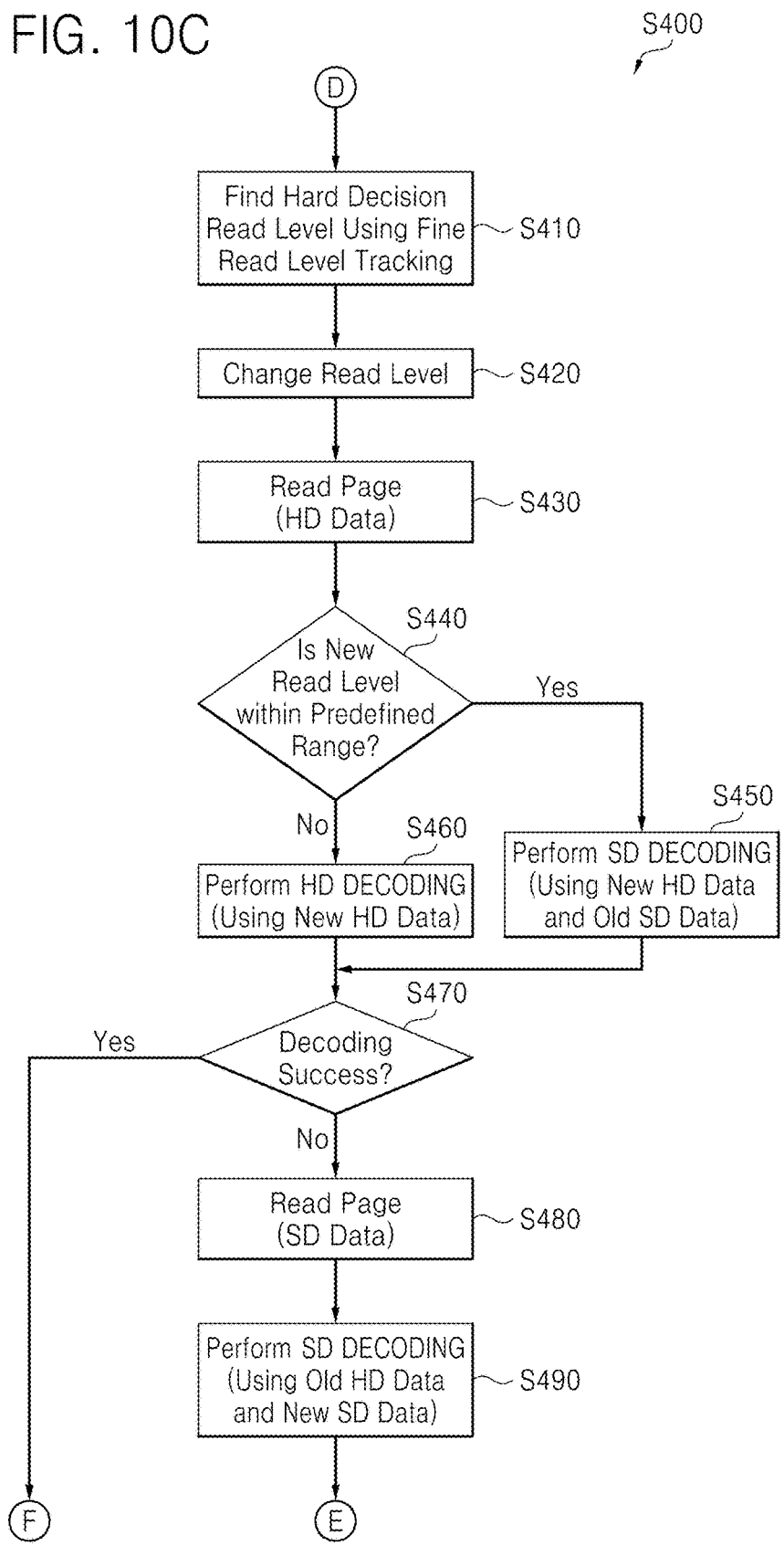

FIG. 10C is a detailed flowchart of the fourth decoding operation S400 illustrated in FIGS. 9B and 9C. The fourth decoding operation S400 is entered when errors are not corrected even after coarse read level tracking and decoding are performed in the third decoding operation S300. In the fourth decoding operation S400, fine read level tracking that enables the valley between distributions to be accurately found is used to more precisely estimate a read level in operation S410. There may be many methods of performing the fine read level tracking, but a second- or third-order regression method may be used in operation S410 to more precisely find the valley between distributions with a minimum number of times of data reading according to the current exemplary embodiments. An example of this method is disclosed in Korean Patent Application No. 10-2012-0119106, the disclosure of which is hereby incorporated by reference in its entirety.

In detail, an HD read level is found using the fine read level tracking in operation S410 and the HD read level is changed in operation S420. HD data is read in operation S430 using the changed HD read level (hereinafter, referred to as a third HD read level) VHD3 obtained as a result of operation S420.

Thereafter, decoding is performed using new HD data in operations S450 or S460. At this time, HD decoding may be performed using only the new HD data in operation S460 or SD decoding may be performed using both new HD data and old SD data, which has been read in the third decoding operation S300, together in operation S450. Since the old SD data that has been read before is used for the SD decoding in operation S450, error correction performance is increased without additional data reading.

For instance, when the new HD read level, i.e., the third HD read level VHD3 found through the fine read level tracking, is within a predefined range from the previous HD read level, i.e., the second HD read level VHD2 (i.e., in case of YES in operation S440), SD decoding may be performed using both the old SD data read in a previous operation and the new HD data read using the third HD read level VHD3 in operation S450. When the new HD read level, i.e., the third HD read level VHD3 found through the fine read level tracking, is out of the predefined range from the previous HD read level, i.e., the second HD read level VHD2 (i.e., in case of NO in operation S440), SD decoding cannot be performed using the old SD data used in the previous operation. At this time, HD decoding is performed using only the new HD data for error correction in operation S460. In other words, SD decoding is performed using previous data as much as possible to increase an error correction likelihood in the fourth decoding operation S400 similarly to the third decoding operation S300.

When the decoding performed in operation S450 or S460 is successful (i.e., in case of YES in operation S470), the method ends in decoding success in operation S710. However, when the decoding performed in operation S450 or S460 fails, that is, errors in data fail to be corrected (i.e., in case of NO in operation S470); new SD data is read in operation S480 and SD decoding is performed in operation S490 using the new SD data and HD data that has been read before.

Operations S480 and S490 are similar to operations S220 and S230. Data is read from memory cells using SD read levels having predefined SD offsets, respectively, from the third HD read level VHD3 in operation S480. At this time, the SD offsets may be the same as or different from the first SD offset VOFF1 and the second SD offset VOFF2. In operation S490, SD decoding is performed using both the SD data read from flash memory in operation S480 and the HD data read from the flash memory in operation S430.

Figure 10D:
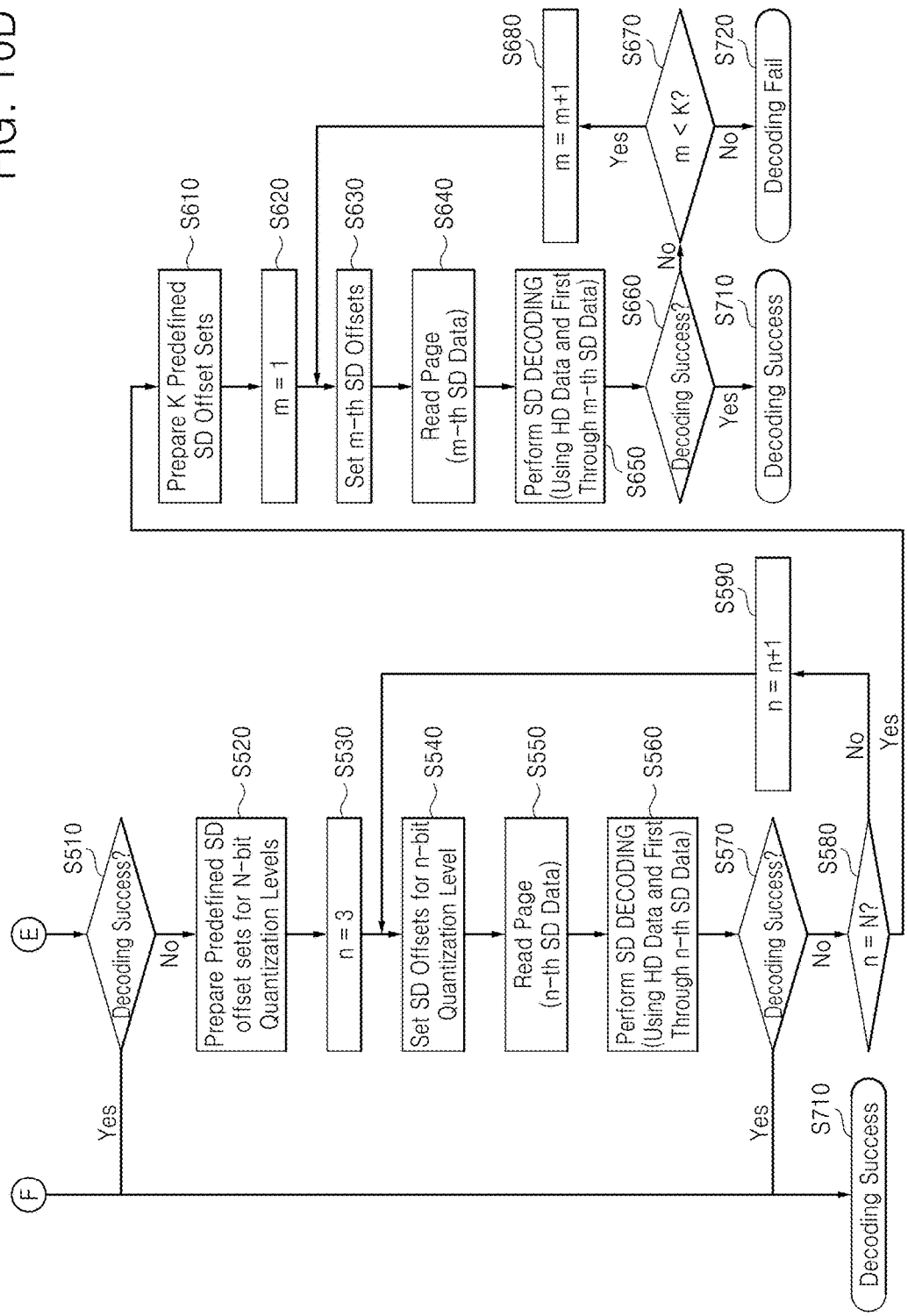

FIG. 10D is a detailed flowchart of the fifth decoding operation S500 illustrated in FIG. 9C. Decoding is performed using additional options that can be employed by the ECC decoder 152 in the fifth decoding operation S500. When the ECC decoder 152 performing SD decoding can operate at an N-bit quantization level (where N is 2 or a natural number greater than 2), the ECC decoder 152 may perform SD decoding with an increasing quantization level. At this time, readout performance is decreased since additional data reading is used to increase the quantization level, but error correction performance is increased when SD decoding is performed. As a result, the probability of correcting errors is increased.

When the decoding performed in the fourth decoding operation S400 is determined as a failure (i.e., in case of NO in operation S510), SD offset sets for the N-bit quantization levels are prepared in operation S520 and a value "n" is initialized in operation S530. Operation S520 of preparing the SD offset set may be performed before decoding, i.e., before the first decoding operation S100, or at the initialization of a memory system. Here, the value "n" is information indicating the number of bits in SD data. In the current exemplary embodiments illustrated in FIG. 10D, the value "n" starts from an initial value of 3 and is increased by one up to a maximum of N, but the inventive concept is not restricted to the current exemplary embodiments and the value of "n" is not particularly limited.

The SD offset sets may include SD offsets for an n-bit quantization level, SD offsets for an (n+1)-bit quantization level, and SD offsets for the N-bit quantization level. The SD offset sets may be stored in a non-volatile memory or a memory controller in advance. For instance, the SD offset sets may be included in advance in program code or firmware executed in the memory controller or may be stored in memory within the memory controller or the non-volatile memory in a table form.

Figure 15A:
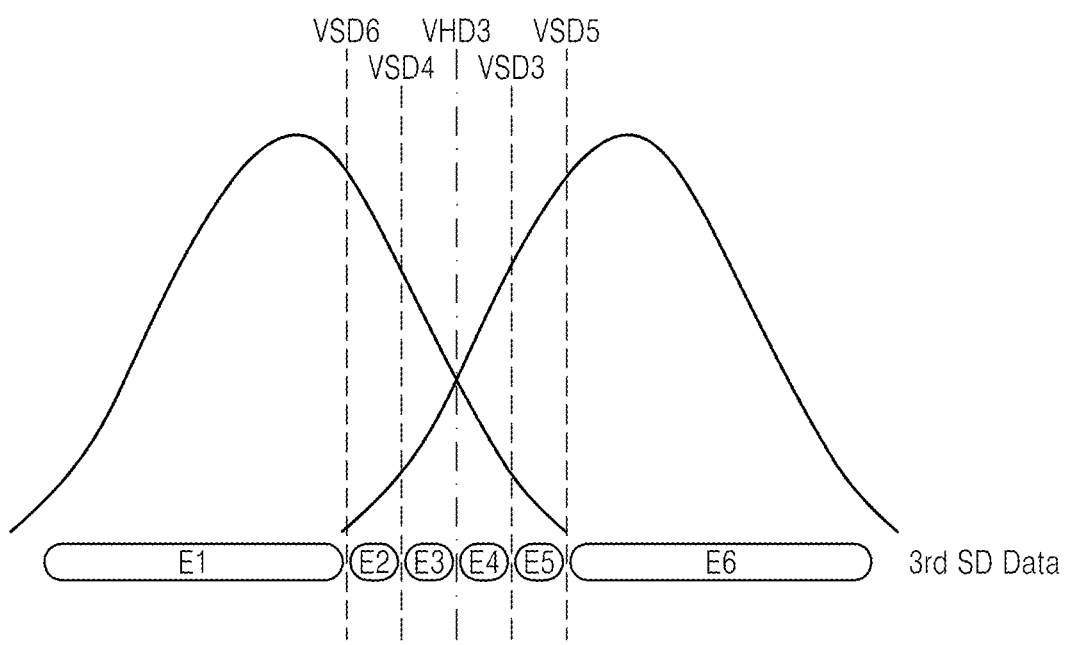
FIGS. 15A and 15B are diagrams for explaining 3-bit soft decision offsets according to some exemplary embodiments.
Figure 15B:
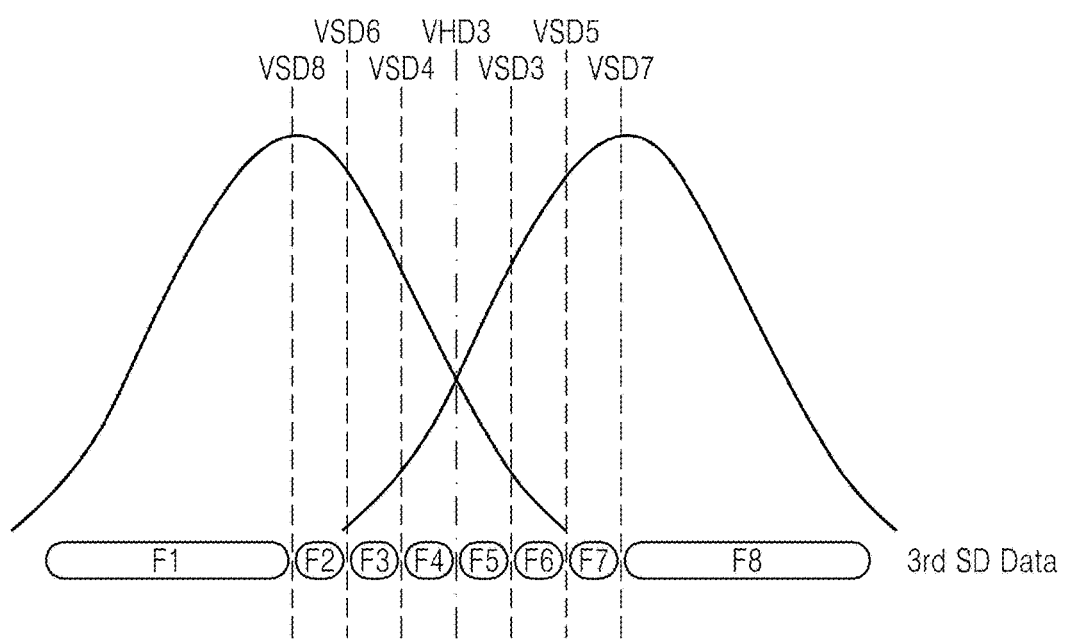

Thereafter, SD offsets for the n-bit quantization level are set in operation S540. Examples of 3-bit SD offsets are illustrated in FIGS. 15A and 15B. Referring to FIGS. 15A and 15B, the 3-bit SD offsets may be offsets (i.e., differences) between a particular HD read level, e.g., the third HD read level VHD3, and respective SD read levels VSD3 through VSD6 in FIG. 15A, or VSD3 through VSD8 in FIG. 15B.

When the SD offsets for the n-bit quantization level are set, SD read levels for reading SD data having the n-bit quantization level are determined. In operation S550, n-bit SD data or n-th SD data is read using the SD read levels that have been determined. In the exemplary embodiments illustrated in FIG. 15A, there are four SD read levels VSD3 through VSD6. Accordingly, SD data, e.g., third SD data, read using the SD read levels VSD3 through VSD6 may have six different values according to sections E1 through E6 to which a cell distribution belongs and the SD data may be expressed in 3-bit data.

In the exemplary embodiments illustrated in FIG. 15B, there are six SD read levels VSD3 through VSD8. Accordingly, SD data, e.g., the third SD data, read using the SD read levels VSD3 through VSD8 may have eight different values according to sections F1 through F8 to which a cell distribution belongs and the SD data may also be expressed in 3-bit data.

When n-bit SD data, i.e., n-th SD data, is read in this manner, SD decoding is performed using the n-th SD data in operation S560. At this time, as well as the n-th SD data, previous data, e.g., HD data and first through (n−1)-th SD data, may be used to perform the SD decoding.

When the decoding performed in operation S560 is determined as a success (i.e., in case of "YES" in operation S570), the method ends in decoding success in operation S710. However, when the decoding performed in operation S560 is determined as a failure, that is, when data errors have not been corrected (i.e., in case of "NO" in operation S570), it is checked whether the value "n" has reached N in operation S580. When the value "n" is less than N (i.e., in case of NO in operation S580), the value "n" is increased by one in operation S590 and the method returns to operation S540.

When the value "n" has reached N (i.e., in case of YES in operation S580), the method proceeds to operation S610. K predefined SD offset sets are prepared in operation S610 and a value "m" is initialized in operation S620. K SD offset sets optimized for K predefined shapes of degraded distributions may be prepared for cases where degradation of the non-volatile memory progresses in an unexpected shape. Operation S610 of preparing K SD offset sets may be performed before decoding, i.e., before the first decoding operation S100, or at the initialization of a memory system. Here, the value "m" is information indicating the number of repetitions. The value "m" starts from an initial value of 1 and is increased by one up to a maximum of K, but the inventive concept is not restricted to this.

The K predefined SD offset sets may be stored in a non-volatile memory or a memory controller in advance. For instance, the K SD offset sets may be included in advance in program code or firmware executed in the memory controller or may be stored in memory within the memory controller or the non-volatile memory in a table form.

Thereafter, m-th SD offsets are set in operation S630. When the m-th SD offsets are set, SD read levels for SD data reading are determined. In operation S640, m-th SD data is read using the SD read level that have been determined.

Thereafter, SD decoding is performed using the m-th SD data in operation S650. At this time, as well as the m-th SD data, previous data, e.g., HD data and first through (m−1)-th SD data, may also be used for the SD decoding.

When the decoding performed in operation S650 is determined as a success (i.e., in case of "YES" in operation S660), the method ends in decoding success in operation S710. However, when the decoding performed in operation S650 is determined as a failure, that is, when data errors have not been corrected (i.e., in case of "NO" in operation S660), it is checked whether the value "m" has reached K in operation S670. When the value "m" is less than K (i.e., in case of YES in operation S670), the value "m" is increased by one in operation S680 and the method returns to operation S630. When the value "m" has reached K (i.e., in case of NO in operation S670), the method ends in decoding fail in operation S720.

Operations S610 through S680 illustrated in FIG. 10D are provided to correct errors even when the distribution degradation progresses in shapes other than normally expected shapes. When the distribution degradation progresses in an expected shape, as many errors as possible are corrected. However, in order to correct errors even at distributions in unexpected shapes or at particular states of distribution degradation that rarely appear but have been known, many predefined SD offset sets (e.g., K SD offset sets) are prepared, data is read using each of the SD offset sets, and SD decoding is performed using the SD data in operations S610 through S680.

In the exemplary embodiments illustrated in FIG. 10D, after decoding is performed with a changing quantization level of the ECC decoder 152 in operations S520 through S590, decoding is performed sequentially using predefined SD offset sets in operation S610 through S680. However, the inventive concept is not restricted to the current exemplary embodiments. In other exemplary embodiments, decoding may be performed while other options of the ECC decoder 152 are changed and various options may be combined when they are used.

According to some exemplary embodiments, one decoding method (e.g., the method illustrated in FIG. 9A, 9B, or 9C) may be used throughout the life of a non-volatile memory system. However, according to other exemplary embodiments, the entire duration of the life of the non-volatile memory system may be divided into two or more stages and a different decoding method is used in a different stage. For instance, during the first half of the life of the non-volatile memory system, one decoding method (e.g., the method illustrated in FIG. 9A) may be used. The success of decoding may not be expected in an HD decoding operation, e.g., the first decoding operation S100 illustrated in FIG. 9A, during the second half of the life due to the degradation of flash memory. Accordingly, the probability of decoding success in the first decoding operation S100 is very low during the second half of the life of the non-volatile memory system. Therefore, a decoding time of the flash memory may be reduced by performing decoding operations other than the first decoding operation S100 in the decoding method illustrated in FIG. 9A during the second half of the life.

Figure 16:
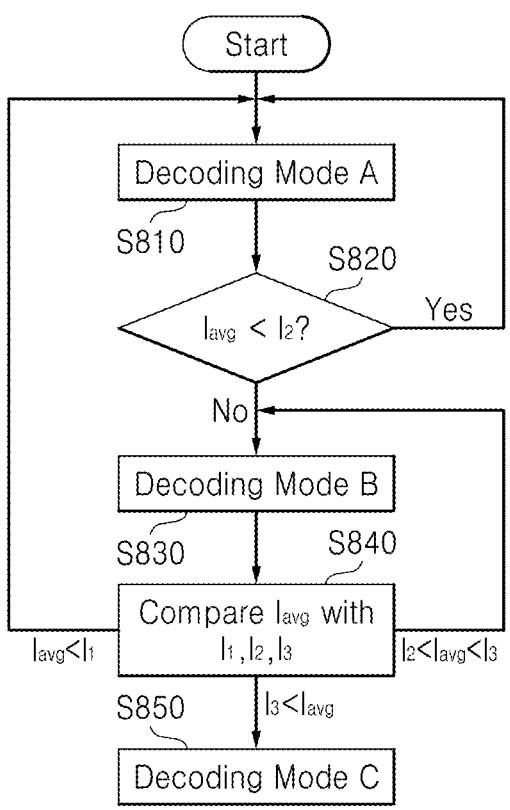
FIG. 16 is a flowchart of a method of changing a data decoding mode according to some exemplary embodiments.
Figure 17:
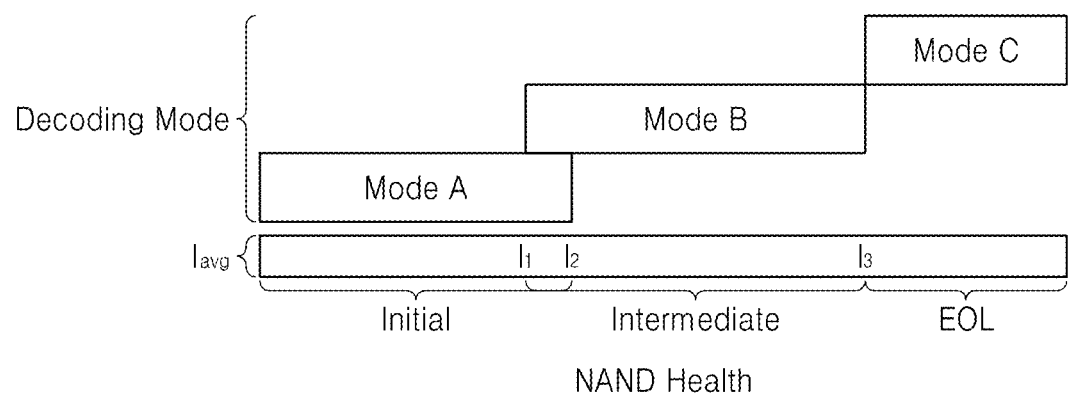
FIG. 17 is a diagram of the change of decoding mode selected according to a degradation index of a non-volatile memory.

FIG. 16 is a flowchart of a data decoding method according to some exemplary embodiments. FIG. 17 is a diagram of decoding modes selected depending on a degradation index Iavg of a non-volatile memory. Referring to FIGS. 16 and 17, the lifespan of a non-volatile memory system may be divided into stages depending on the degree of degradation of the non-volatile memory and a different decoding mode may be applied to different stages. Each decoding mode may include a plurality of decoding operations according to some exemplary embodiments.

Referring to FIG. 16, decoding mode A is performed in an initial stage of the non-volatile memory system in operation S810. Decoding mode A may include a plurality of decoding operations (e.g., operations S100 and S200 illustrated in FIG. 9A, or operations S100, S200, and S300 illustrated in FIG. 9A).

In decoding mode A, the degradation index $I_{avg}$ of the non-volatile memory is periodically or nonperiodically compared with a threshold $I_2$ to find out whether the degradation index $I_{avg}$ is less than the threshold $I_2$ in operation S820. The threshold $I_2$ may be predetermined. When the degradation index $I_{avg}$ is less than the threshold $I_2$ (i.e., in case of YES in operation S820), decoding mode A is continued. In otherwise case (i.e., in case of NO in operation S820), decoding mode B is performed in operation S830. Decoding mode B may include a plurality of decoding operations (e.g., operations S200 and S300 illustrated in FIG. 9A, or operations S200 through S400 illustrated in FIG. 9B). At this time, the decoding operations in decoding mode B may partially overlap with the decoding operations in decoding mode A, but the decoding operations are not entirely the same as those in decoding mode A. In decoding mode B, the degradation index $I_{avg}$ of the non-volatile memory is compared with a plurality of thresholds $I_1$, $I_2$, $I_3$ in operation S840. In response to the comparison, decoding mode B may be continued, the method may return to decoding mode A, or decoding mode C may be performed depending on the comparison result.

In detail, when the degradation index $I_{avg}$ is less than the threshold $I_1$, the method returns to decoding mode A. When the degradation index $I_{avg}$ is greater than the threshold $I_3$, decoding mode C is performed. When the degradation index $I_{avg}$ is between the thresholds $I_1$ and $I_3$, decoding mode B is continued.

In the exemplary embodiments illustrated in FIGS. 16 and 17, three decoding modes are defined and each decoding mode is selectively run according to the degree of degradation of the non-volatile memory. However, the inventive concept is not restricted to this, and the number of modes may be more or less than three. In addition, the number of repetitions of decoding performed by the ECC decoder 152 is used as the degradation index $I_{avg}$ indicating the degree of the degradation of the non-volatile memory in the current exemplary embodiments, but the inventive concept is not restricted thereto. For instance, the degradation index $I_{avg}$ may be at least among the number of program-erase cycles, the number of read cycles, the number of ECC decoding successes/fails, the number of errors in a codeword at the time of ECC decoding success, the average number of errors per predetermined interval during a decoding procedure, the average number of iterations per predetermined interval during a decoding procedure, or the variation in the number of cells in a distribution or a particular read level of monitoring data that has been recorded to check the state of NAND degradation.

Figure 18:
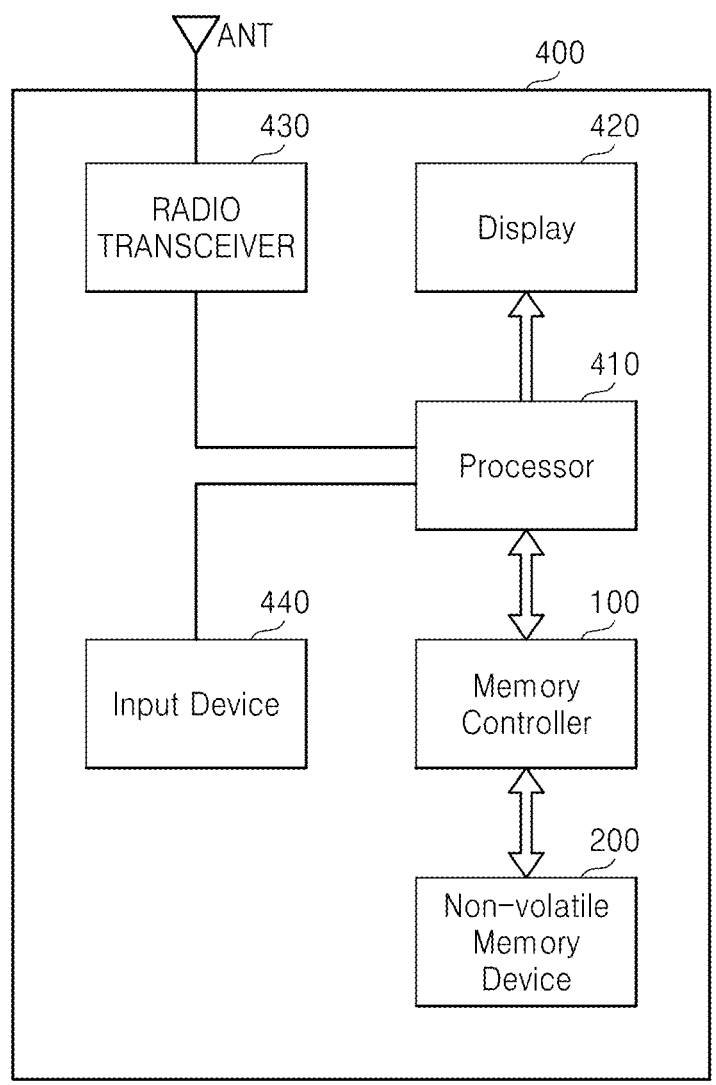
FIG. 18 is a block diagram of an electronic system including the non-volatile memory device according to some exemplary embodiments.

FIG. 18 is a block diagram of an electronic system 400 including the non-volatile memory device according to some exemplary embodiments. Referring to FIG. 18, the electronic system 400 may be implemented as a cellular phone, a smart phone, a tablet personal computer (PC), a personal digital assistant (PDA) or a radio communication system.

The electronic system 400 includes the non-volatile memory device 200 and a memory controller 100 controlling the operations of the non-volatile memory device 200. The memory controller 100 may control the data access operations, e.g., a program operation, an erase operation, and a read operation, of the non-volatile memory device 200 according to the control of a processor 410. The processor 410 may be one or more microprocessors.

The page data programmed in the non-volatile memory device 200 may be displayed through a display 420 according to the control of the processor 410 and/or the memory controller 100.

A radio transceiver 430 transmits or receives radio signals through an antenna ANT. The radio transceiver 430 may convert radio signals received through the antenna ANT into signals that can be processed by the processor 410. Accordingly, the processor 410 may process the signals output from the radio transceiver 430 and transmit the processed signals to the memory controller 100 or the display 420. The memory controller 100 may program the signals processed by the processor 410 to the non-volatile memory device 200. The radio transceiver 430 may also convert signals output from the processor 410 into radio signals and outputs the radio signals to an external device through the antenna ANT.

An input device 440 enables control signals for controlling the operation of the processor 410 or data to be processed by the processor 410 to be input to the electronic system 400. The input device 440 may be implemented by a pointing device such as a touch pad or a computer mouse, a keypad, or a keyboard.

The processor 410 may control the operation of the display 420 to display data output from the memory controller 100, data output from the radio transceiver 430, or data output from the input device 440. The memory controller 100, which controls the operations of the non-volatile memory device 200, may be implemented as a part of the processor 410 or as a separate chip.

Figure 19:
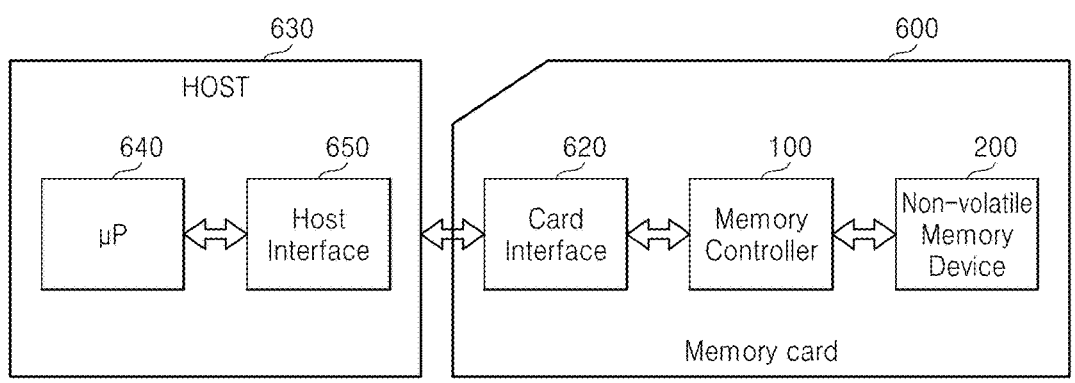
FIG. 19 is a block diagram of an electronic system including the non-volatile memory device according to other exemplary embodiments.

FIG. 19 is a block diagram of an electronic system 600 including the non-volatile memory device according to other exemplary embodiments. The electronic system 600 may be implemented as a memory card or a smart card. The electronic system 600 includes the non-volatile memory device 200, a memory controller 100, and a card interface 620.

The memory controller 100 may control data exchange between the non-volatile memory device 200 and the card interface 620. The card interface 620 may be a secure digital (SD) card interface or a multi-media card (MMC) interface, but the inventive concept is not restricted to the current exemplary embodiments.

The card interface 620 may interface a host 630 and the memory controller 100 for data exchange according to a protocol of the host 630. The card interface 620 may support a universal serial bus (USB) protocol and an interchip (IC)-USB protocol. Here, the card interface 620 may indicate a hardware supporting a protocol used by the host 630, a software installed in the hardware, or a signal transmission mode.

When the electronic system 600 is connected with a host interface 350 of the host 630 such as a PC, a tablet PC, a digital camera, a digital audio player, a cellular phone, a console video game hardware, or a digital set-top box, the host interface 350 may perform data communication with the non-volatile memory device 200 through the card interface 620 and the memory controller 100 according to the control of a microprocessor 640.

Figure 20:
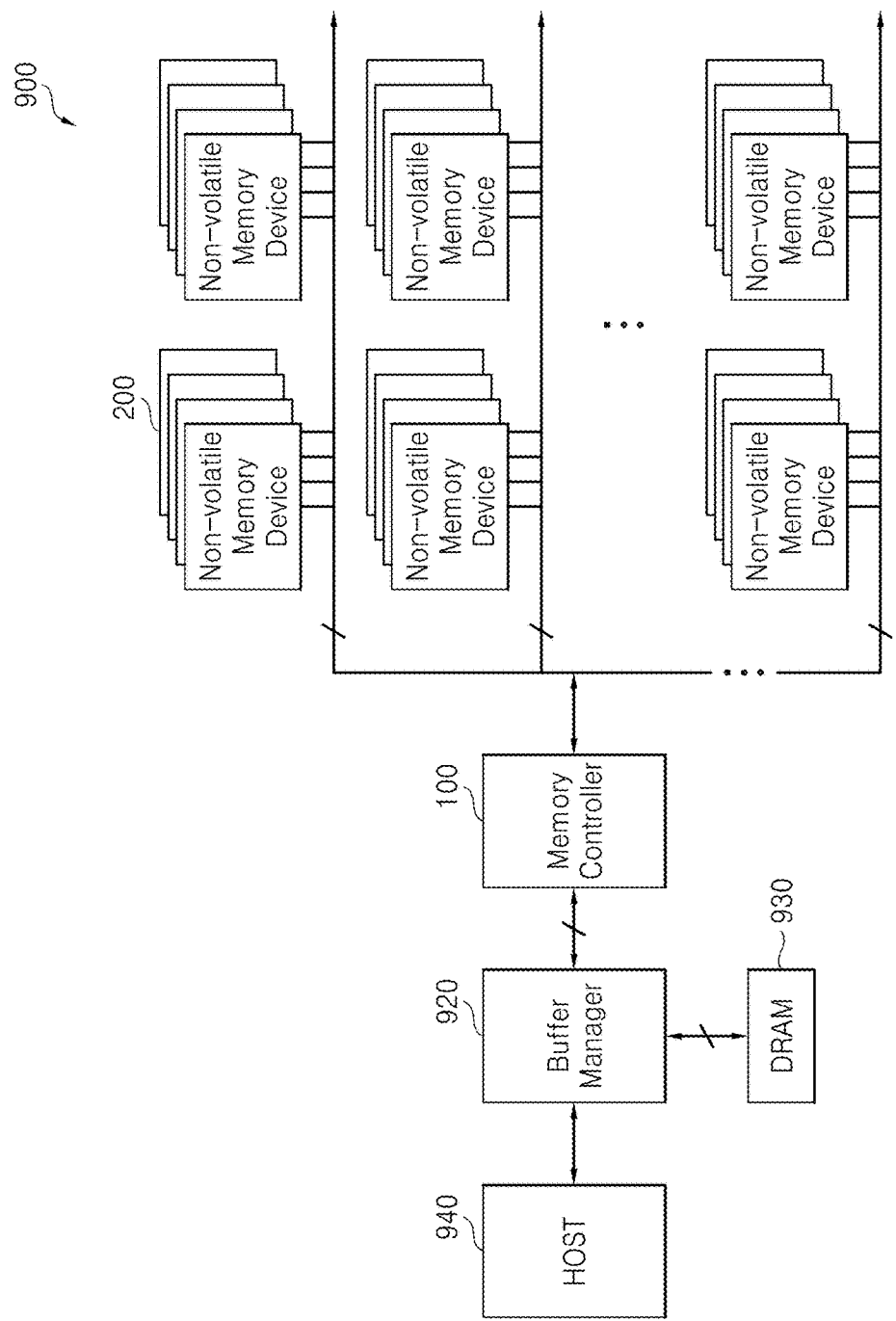
FIG. 20 is a block diagram of an electronic system including the non-volatile memory device according to further exemplary embodiments.

FIG. 20 is a block diagram of an electronic system 900 including the non-volatile memory device according to further exemplary embodiments. The electronic system 900 may be implemented as a data processor like a solid state drive (SSD).

The electronic system 900 includes a plurality of non-volatile memory devices 200, a memory controller 110 controlling the data processing operations of the non-volatile memory devices 200, a volatile memory device 930 like a dynamic random access memory (DRAM), and a buffer manager 920 controlling data transferred between the memory controller 100 and a host 940 to be stored in the volatile memory device 930.

Figure 21:
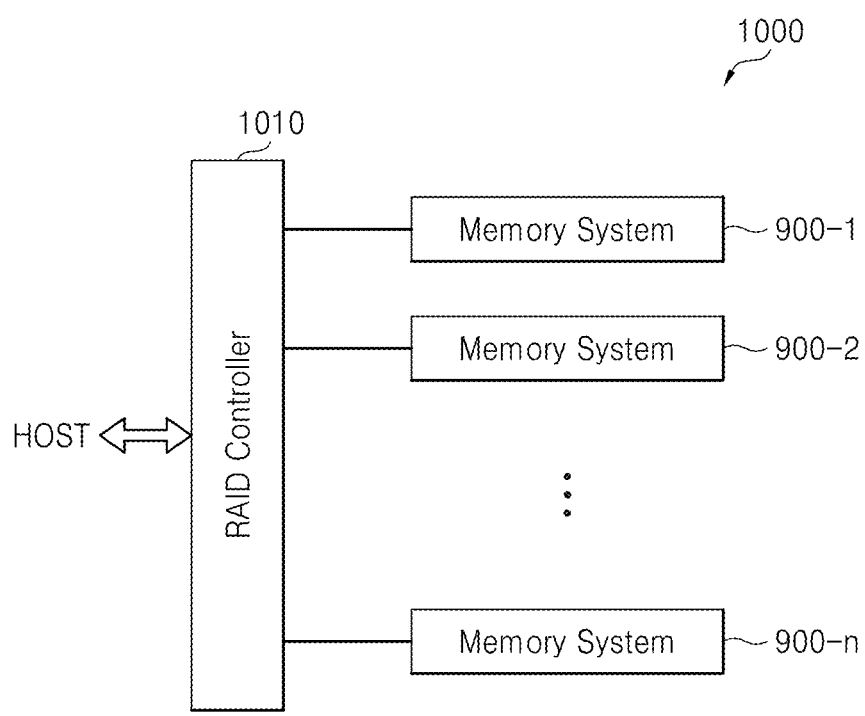
FIG. 21 is a block diagram of a data processing system including the non-volatile memory device according to some exemplary embodiments.

FIG. 21 is a block diagram of a data processing system 1000 including the non-volatile memory device according to some exemplary embodiments. The data processing system 1000 may be implemented as a redundant array of independent disks (RAID) system. The data processing system 1000 includes a RAID controller 1010 and a plurality of memory systems 900-1 through 900-n where "n" is a natural number.

Each of the memory systems 900-1 through 900-n may be the electronic system 900 illustrated in FIG. 20. The memory systems 900-1 through 900-n may form a RAID array. The data processing system 1000 may be a PC or an SSD.

During a program operation, the RAID controller 1010 may transmit program data output from a host to at least one of the memory systems 900-1 through 900-n according to a RAID level in response to a program command received from the host. During a read operation, the RAID controller 1010 may transmit to the host data read from at least one of the memory systems 900-1 through 900-n in response to a read command received from the host.

The present general inventive concept can also be embodied as computer-readable codes that are stored on a computer-readable medium. The computer-readable recording medium is any data storage device that can store data as a program which can be thereafter read and executed by a computer, a processor, integrated circuit or a computer system. Examples of the computer-readable recording medium include read-only memory (ROM), random-access memory (RAM), CD-ROMs, magnetic tapes, floppy disks, and optical data storage devices.

The computer-readable recording medium can also be distributed over network coupled computer systems so that the computer-readable code is stored and executed in a distributed fashion. Also, functional programs, codes, and code segments to accomplish the present general inventive concept can be easily construed by programmers.

As described above, according to some exemplary embodiments, different error correction operations are defined and selectively used, thereby optimizing error correction performance and data restoration time.

While exemplary embodiments have been particularly shown and described, it will be understood by those of ordinary skill in the art that various changes in forms and details may be made therein without departing from the spirit and scope of the inventive concept as defined by the following claims.

What is claimed is:

1. A method of decoding data of a non-volatile memory device, the method comprising:
   a first decoding operation that comprises reading first hard decision data from the non-volatile memory device using a first hard decision read level and performing decoding using the first hard decision data;
   a second decoding operation that comprises reading first soft decision data from the non-volatile memory device when the decoding fails in the first decoding operation and performing decoding using the first soft decision; and
   a third decoding operation that comprises changing the first hard decision read level into a second hard decision read level when the decoding fails in the second decoding operation, reading second hard decision data using the second hard decision read level, and performing decoding either using the second hard decision data or using both the second hard decision data and the first soft decision data.

2. The method of claim 1, wherein the third decoding operation further comprises:
   reading second soft decision data based on the second hard decision read level when the decoding fails in the third decoding operation, and performing decoding using the second hard decision data and the second soft decision data.

3. The method of claim 2, wherein the second hard decision read level is determined using a first read level tracking technique.

4. The method of claim 3, wherein the second decoding operation further comprises reading the first soft decision data using a first soft decision read level having a first soft decision offset from the first hard decision read level, and a second soft decision read level having a second soft decision offset from the first hard decision read level.

5. The method of claim 4, wherein reading the second soft decision data comprises reading the second soft decision data using a third soft decision read level having a third soft decision offset from the second hard decision read level, and a fourth soft decision read level having a fourth soft decision offset from the second hard decision read level; and
   the third soft decision offset and the fourth soft decision offset are different from the first soft decision offset and the second soft decision offset, respectively.

6. The method of claim 4, wherein the reading the second soft decision data comprises reading the second soft decision data using a third soft decision read level having a third soft decision offset from the second hard decision read level, and a fourth soft decision read level having a fourth soft decision offset from the second hard decision read level; and
   the third soft decision offset and the fourth soft decision offset are the same as the first soft decision offset and the second soft decision offset, respectively.

7. The method of claim 3, wherein the hard decision decoding is performed using only the second hard decision data when the second hard decision read level is out of a predefined range from the first hard decision read level; and
   soft decision decoding is performed using both the second hard decision data and the first soft decision data when the second hard decision read level is within the predefined range from the first hard decision read level.

8. The method of claim 3, further comprising a fourth decoding operation performed when the decoding fails in the third decoding operation,
   wherein the fourth decoding operation comprises:
   changing the second hard decision read level into a third hard decision read level, reading third hard decision data using the third hard decision read level, and performing decoding either using only the third hard decision data or using both the third hard decision data and soft decision data that has been read before; and
   reading third soft decision data based on the third hard decision read level when the decoding using the third hard decision data fails, and performing decoding using the third soft decision data.

9. The method of claim 8, wherein the third hard decision read level is determined using a second read level tracking technique; and
   the first read level tracking technique is different from the second read level tracking technique.

10. The method of claim 9, wherein
   hard decision decoding is performed using only the third hard decision data when the third hard decision read level is out of a predefined range from the second hard decision read level; and
   soft decision decoding is performed using both the third hard decision data and the second soft decision data when the third hard decision read level is within the predefined range from the second hard decision read level.

11. The method of claim 8, wherein the reading of the third soft decision data uses soft decision offsets, and the soft decision offsets used for reading the third soft decision data are different than the first and second soft decision offsets, respectively, for the reading of the first soft decision data.

12. The method of claim 8, wherein the reading the third soft decision data uses soft decision offsets, and the soft decision offsets used for the reading the third soft decision data are the same as the first and second soft decision offsets, respectively, for the reading of the first soft decision data.

13. The method of claim 2, further comprising, between the first decoding operation and the second decoding operation, the operation of:
setting a hard decision read level used in a previous successful decoding as a third hard decision read level when the decoding fails in the first decoding operation, reading third hard decision data using the third hard decision read level, and performing decoding using the third hard decision data.

14. The method of claim 2, further comprising, between the first decoding operation and the second decoding operation, the operation of:
setting one of at least one predefined read level as a third hard decision read level when the decoding fails in the first decoding operation, reading third hard decision data using the third hard decision read level, and performing decoding using the third hard decision data.

15. A method of decoding data of a non-volatile memory device including a non-volatile memory, the method comprising:
setting, using a memory controller in operation with a buffer memory, a plurality of decoding modes; and
selecting and performing, using the memory controller, at least one of the decoding modes according to a degradation index of the non-volatile memory of the non-volatile memory device,
wherein the decoding modes comprise a first decoding mode and a second decoding mode, and
the selecting and performing the at least one of the decoding modes comprises:
performing the first decoding mode in an initial stage of the non-volatile memory device;
changing into the second decoding mode when the degradation index is greater than a second threshold in the first decoding mode; and
returning back to the first decoding mode when the degradation index is less than a first threshold in the second decoding mode.

16. The method of claim 15, wherein each of the decoding modes comprises a plurality of decoding operations,
wherein the decoding operations of the selected decoding mode are performed such that a subsequent decoding operation provides higher error correction performance but increases a data read time for performing decoding than a decoding operation performed prior to the subsequent decoding operation.

17. The method of claim 16, wherein each of the decoding modes comprises a plurality of predefined decoding operations, and
for each decoding mode, at least one of a read level changing method, a decoding method, an error correction performance, and a data read time is different than that of the other decoding modes.

18. A method of error correction code (ECC) decoding, the method comprising:
reading hard decision data from a non-volatile memory device using a hard decision read level and performing ECC decoding using the read hard decision data to detect and correct errors in the hard decision data;
when the ECC decoding fails to correct the errors in the hard decision data, reading soft decision data and performing ECC decoding using the soft decision data to detect and correct errors in the soft decision data; and
when the ECC decoding fails to correct the errors in the soft decision data, changing the hard decision read level, reading the hard decision data using the changed hard decision read level, and performing ECC decoding using the read hard decision data using the changed hard decision read level.

19. The method of claim 18, wherein the performing the ECC decoding using the reread hard decision data further uses the soft decision data.

* * * * *